US009612286B2

(12) United States Patent
Gupta et al.

(10) Patent No.: US 9,612,286 B2
(45) Date of Patent: Apr. 4, 2017

(54) SYSTEMS AND METHODS FOR IMPROVING THE ACCURACY OF APPLIANCE LEVEL DISAGGREGATION IN NON-INTRUSIVE APPLIANCE LOAD MONITORING TECHNIQUES

(75) Inventors: Abhay Gupta, Cupertino, CA (US); Vivek Garud, Cupertino, CA (US); Uri Rodney, La Jolla, CA (US); Subodh Bapat, Palo Alto, CA (US)

(73) Assignee: Bidgely Inc., Sunnyvale, CA (US)

( * ) Notice: Subject to any disclaimer, the term of this patent is extended or adjusted under 35 U.S.C. 154(b) by 372 days.

(21) Appl. No.: 13/366,850

(22) Filed: Feb. 6, 2012

(65) Prior Publication Data
US 2013/0110621 A1    May 2, 2013

Related U.S. Application Data

(60) Provisional application No. 61/439,826, filed on Feb. 4, 2011, provisional application No. 61/485,073, filed
(Continued)

(51) Int. Cl.
*G01R 31/34* (2006.01)
*G06F 15/00* (2006.01)
(Continued)

(52) U.S. Cl.
CPC ............ *G01R 31/34* (2013.01); *G01D 4/004* (2013.01); *G06F 15/00* (2013.01);
(Continued)

(58) Field of Classification Search
CPC .... G01R 31/34; G06Q 30/0254; G06Q 50/06; H02J 3/14; Y02B 70/3225;
(Continued)

(56) References Cited

U.S. PATENT DOCUMENTS 4,858,141 A      8/1989  Hart et al.
5,483,153 A  *   1/1996  Leeb et al. ................. 324/76.12
(Continued)

FOREIGN PATENT DOCUMENTS

GB        2475172 A  *   5/2011
WO     2010129913 A       11/2010
(Continued)

OTHER PUBLICATIONS

Patent Cooperation Treaty International Search Report, PCT/US 12/23969.

*Primary Examiner* — M. N. Von Buhr
(74) *Attorney, Agent, or Firm* — Landmark Intellectual Property Law, PLLC

(57) ABSTRACT

The present invention generally teaches systems and methods for creating appliance signatures based upon whole house composite load profiles. Methods may includes steps such as identifying primitive elements including transients and absolute steady state levels; clustering the primitive elements along multiple dimensions to form impulses; combining impulses to form simple bundles; combining simple bundles with each other or impulses to form complex bundles; and determining specific appliance signatures that substantially match the complex bundles. Methods may also include steps such as determining transitions within the whole house composite load profile; determining household specific appliance state machines for each appliance in the household; and disaggregating the whole house composite load profile into individual appliance energy loads by assigning the determined transitions to the determined household specific appliance state machines.

21 Claims, 16 Drawing Sheets

Related U.S. Application Data on May 11, 2011, provisional application No. 61/542,610, filed on Oct. 3, 2011.

(51) Int. Cl.
 *G06Q 30/02* (2012.01)
 *G01D 4/00* (2006.01)

(52) U.S. Cl.
 CPC ...... *G06Q 30/0254* (2013.01); *Y02B 70/3266* (2013.01); *Y02B 90/242* (2013.01); *Y04S 20/242* (2013.01); *Y04S 20/322* (2013.01); *Y04S 20/38* (2013.01)

(58) Field of Classification Search
 CPC . Y02B 90/242; Y02B 70/3266; Y04S 20/222; Y04S 20/242; Y04S 20/322; Y04S 20/38; G01D 4/004; G06F 15/00
 USPC .... 700/286, 291; 702/60, 61, 179–185, 188; 705/412
 See application file for complete search history.

(56) References Cited

U.S. PATENT DOCUMENTS

| | | | |
|---|---|---|---|
| 5,566,084 A * | 10/1996 | Cmar | 700/276 |
| 5,717,325 A * | 2/1998 | Leeb et al. | 324/76.12 |
| 5,910,875 A | 6/1999 | Tian et al. | |
| 6,081,123 A | 6/2000 | Kasbarian et al. | |
| 6,529,839 B1 | 3/2003 | Uggerud et al. | |
| 6,816,078 B2 | 11/2004 | Onoda et al. | |
| 6,836,737 B2 | 12/2004 | Petite et al. | |
| 6,850,735 B2 | 2/2005 | Sugar et al. | |
| 6,891,838 B1 | 5/2005 | Petite et al. | |
| 6,906,617 B1 | 6/2005 | Van der Meulen | |
| 6,937,946 B1 | 8/2005 | Culp et al. | |
| 6,993,417 B2 | 1/2006 | Osann, Jr. | |
| 7,174,260 B2 | 2/2007 | Tuff et al. | |
| 7,246,014 B2 | 7/2007 | Forth et al. | |
| 7,693,670 B2 | 4/2010 | Durling et al. | |
| 7,788,208 B2 | 8/2010 | Kobayashi et al. | |
| 7,885,917 B2 | 2/2011 | Kuhns et al. | |
| 8,014,964 B1 | 9/2011 | Khalsa | |
| 8,094,034 B2 | 1/2012 | Patel et al. | |
| 8,156,055 B2 | 4/2012 | Shimada et al. | |
| 8,170,695 B2 | 5/2012 | Spicer et al. | |
| 8,185,333 B2 | 5/2012 | Jonsson et al. | |
| 8,209,062 B2 | 6/2012 | Andrews et al. | |
| 8,239,073 B2 | 8/2012 | Fausak et al. | |
| 8,260,468 B2 | 9/2012 | Ippolito et al. | |
| 8,260,471 B2 | 9/2012 | Storch et al. | |
| 8,275,561 B2 | 9/2012 | Alles | |
| 8,311,754 B2 | 11/2012 | Alles | |
| 8,334,784 B2 | 12/2012 | Patel et al. | |
| 8,340,831 B2 | 12/2012 | Benitez et al. | |
| 8,344,724 B2 | 1/2013 | Leeb et al. | |
| 8,350,697 B2 | 1/2013 | Trundle et al. | |
| 8,352,082 B2 | 1/2013 | Parker et al. | |
| 8,355,827 B2 | 1/2013 | Egnor et al. | |
| 8,364,609 B2 | 1/2013 | Ozog | |
| 8,369,998 B2 | 2/2013 | Drake et al. | |
| 8,396,821 B2 | 3/2013 | Kuhns et al. | |
| 8,412,491 B2 | 4/2013 | Souilmi | |
| 8,554,501 B2 * | 10/2013 | Diop et al. | 702/61 |
| 8,560,134 B1 * | 10/2013 | Lee | 700/291 |
| 8,738,195 B2 * | 5/2014 | Aldridge | G06N 5/04 340/12.32 |
| 8,799,205 B2 * | 8/2014 | Shetty et al. | 706/52 |
| 8,812,427 B2 * | 8/2014 | Kim et al. | 706/52 |
| 8,843,334 B2 * | 9/2014 | Donaldson et al. | 702/66 |
| 8,942,934 B2 * | 1/2015 | Kitagawa | G05B 15/02 702/61 |
| 8,983,670 B2 * | 3/2015 | Shetty et al. | 700/291 |
| 9,020,769 B2 * | 4/2015 | Rada et al. | 702/60 |
| 2003/0106062 A1 * | 6/2003 | Shteyn et al. | 725/78 |
| 2008/0157936 A1 | 7/2008 | Ebrom et al. | |
| 2009/0045804 A1 | 2/2009 | Durling et al. | |
| 2009/0093916 A1 | 4/2009 | Parsonnet et al. | |
| 2009/0292402 A1 | 11/2009 | Cruickshank, III | |
| 2010/0305889 A1 * | 12/2010 | Tomlinson et al. | 702/62 |
| 2010/0305998 A1 | 12/2010 | De La Torre Bueno et al. | |
| 2011/0025519 A1 * | 2/2011 | Donaldson et al. | 340/664 |
| 2011/0144819 A1 * | 6/2011 | Andrews et al. | 700/291 |
| 2011/0251933 A1 | 10/2011 | Egnor et al. | |
| 2011/0270453 A1 * | 11/2011 | Kalogridis et al. | 700/291 |
| 2011/0271352 A1 * | 11/2011 | Kalogridis et al. | 726/26 |
| 2011/0282506 A1 | 11/2011 | Amram et al. | |
| 2011/0282808 A1 | 11/2011 | Amram et al. | |
| 2011/0288905 A1 | 11/2011 | Mrakas | |
| 2011/0301894 A1 | 12/2011 | Sanderford | |
| 2011/0307200 A1 | 12/2011 | Hsu et al. | |
| 2012/0004871 A1 | 1/2012 | Tsao et al. | |
| 2012/0041696 A1 | 2/2012 | Sanderford et al. | |
| 2012/0101653 A1 | 4/2012 | Tran | |
| 2012/0123995 A1 | 5/2012 | Boot | |
| 2012/0131324 A1 | 5/2012 | Ansari et al. | |
| 2012/0136593 A1 | 5/2012 | Donaldson et al. | |
| 2012/0143387 A1 | 6/2012 | Indovina et al. | |
| 2012/0166233 A1 | 6/2012 | Wengrovitz et al. | |
| 2012/0176252 A1 | 7/2012 | Drew et al. | |
| 2012/0197560 A1 | 8/2012 | Kuhns et al. | |
| 2012/0265586 A1 | 10/2012 | Mammone | |
| 2012/0271576 A1 | 10/2012 | Kamel et al. | |
| 2012/0278272 A1 | 11/2012 | Kim et al. | |
| 2012/0280833 A1 | 11/2012 | Jonsson et al. | |
| 2012/0290230 A1 | 11/2012 | Berges Gonzalez et al. | |
| 2012/0303619 A1 | 11/2012 | Fisera et al. | |
| 2012/0310435 A1 | 12/2012 | Taft | |
| 2012/0316808 A1 | 12/2012 | Frader-Thompson et al. | |
| 2013/0035992 A1 | 2/2013 | Silverman | |
| 2013/0038468 A1 | 2/2013 | Wang et al. | |
| 2013/0057386 A1 | 3/2013 | Drake et al. | |
| 2013/0066479 A1 | 3/2013 | Shetty et al. | |
| 2013/0076119 A1 | 3/2013 | Yogeeswaran et al. | |
| 2013/0076339 A1 | 3/2013 | Veronesi et al. | |
| 2013/0080092 A1 | 3/2013 | Yogeeswaran et al. | |
| 2013/0096987 A1 | 4/2013 | Omitaomu et al. | |
| 2013/0103215 A1 | 4/2013 | Dai et al. | |
| 2013/0103656 A1 | 4/2013 | Sanchez Loureda et al. | |
| 2013/0106185 A1 | 5/2013 | Park et al. | |
| 2013/0110297 A1 | 5/2013 | Reichmuth et al. | |
| 2013/0238266 A1 * | 9/2013 | Savvides | G06Q 50/06 702/61 |
| 2013/0289788 A1 * | 10/2013 | Gupta et al. | 700/291 |
| 2013/0338948 A1 * | 12/2013 | Zeifman | 702/60 |
| 2014/0129160 A1 * | 5/2014 | Tran | 702/61 |
| 2014/0149056 A1 * | 5/2014 | Lelkens et al. | 702/61 |
| 2014/0207298 A1 * | 7/2014 | Gupta et al. | 700/291 |
| 2014/0358456 A1 * | 12/2014 | Du et al. | 702/60 |

FOREIGN PATENT DOCUMENTS

| | | |
|---|---|---|
| WO | 2011002735 A | 1/2011 |
| WO | 2011012840 A | 2/2011 |
| WO | 2011057049 A | 5/2011 |
| WO | 2011057072 A | 5/2011 |
| WO | 2011058328 A | 5/2011 |
| WO | 2011084390 A | 7/2011 |
| WO | 2011091444 A | 7/2011 |
| WO | 2011127313 A | 10/2011 |
| WO | 2011128883 A | 10/2011 |
| WO | 2011130670 A | 10/2011 |
| WO | 2011131984 A | 10/2011 |
| WO | 2011153401 A | 12/2011 |
| WO | 2011161476 A | 12/2011 |
| WO | 2011161477 A | 12/2011 |
| WO | 2012021372 A | 2/2012 |
| WO | 2012038858 A | 3/2012 |
| WO | 2012040301 A | 3/2012 |
| WO | 2012049601 A | 4/2012 |
| WO | 2012052868 A | 4/2012 |
| WO | 2012082120 A | 6/2012 |
| WO | 2012082802 A | 6/2012 |
| WO | 2012095870 A | 7/2012 |

(56) References Cited

FOREIGN PATENT DOCUMENTS

| | | | |
|---|---|---|---|
| WO | 2012101552 A | 8/2012 |
| WO | 2012101610 A | 8/2012 |
| WO | 2012103138 A | 8/2012 |
| WO | 2012103485 A | 8/2012 |
| WO | 2012145099 A | 10/2012 |
| WO | 2012146559 A | 11/2012 |
| WO | 2012160062 A | 11/2012 |
| WO | 2012162646 A | 11/2012 |
| WO | 2012172352 A | 12/2012 |
| WO | 2013001395 A | 1/2013 |
| WO | 2013011425 A | 1/2013 |
| WO | 2013038298 A | 3/2013 |
| WO | 2013043863 A | 3/2013 |

\* cited by examiner

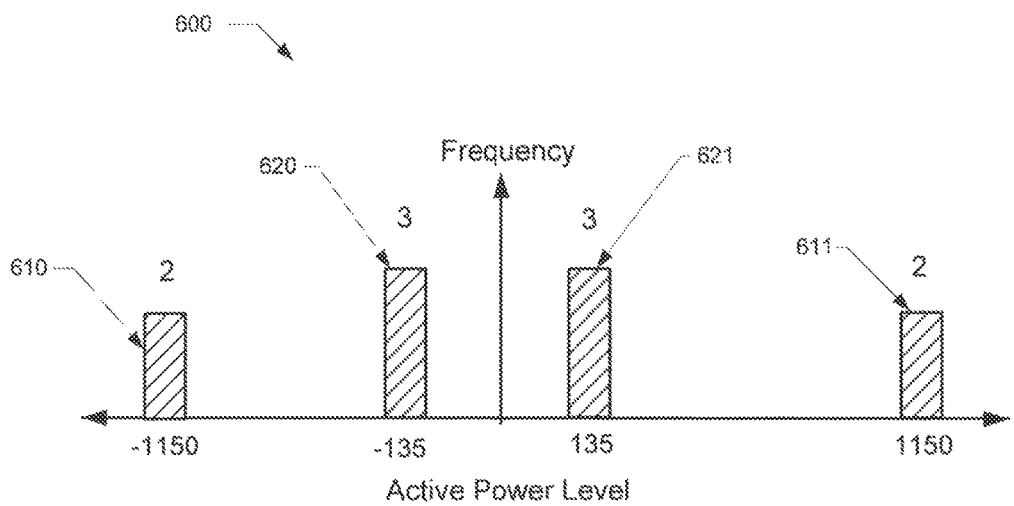
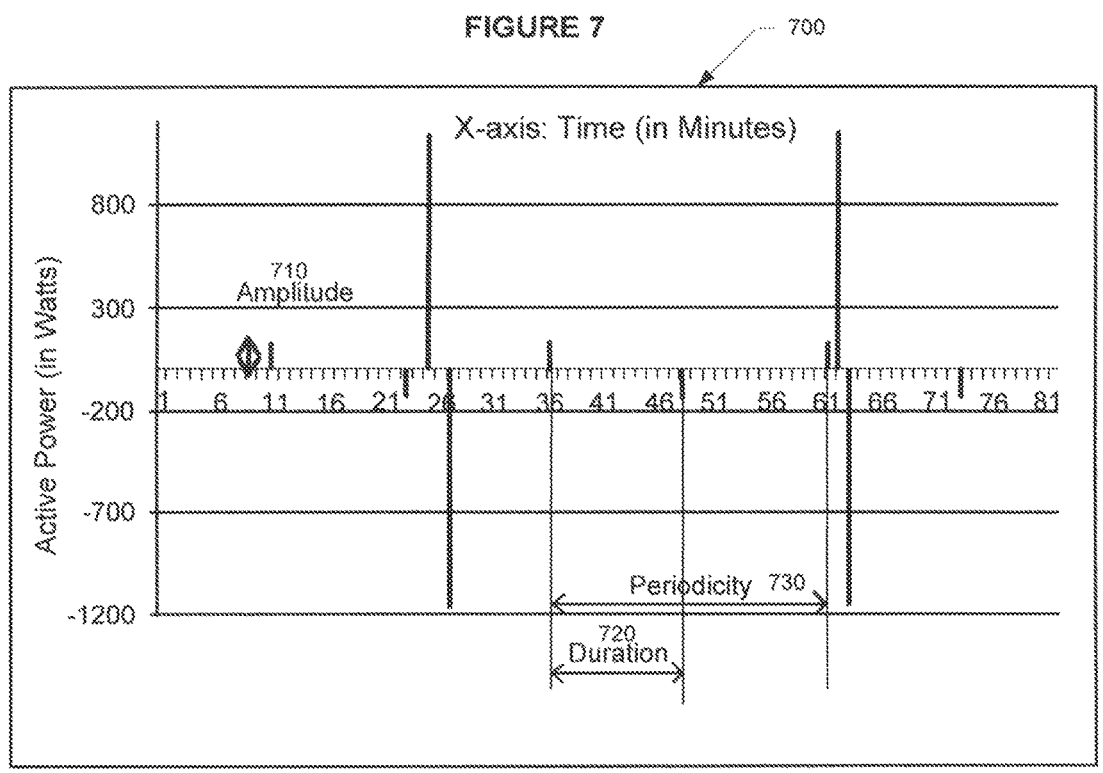

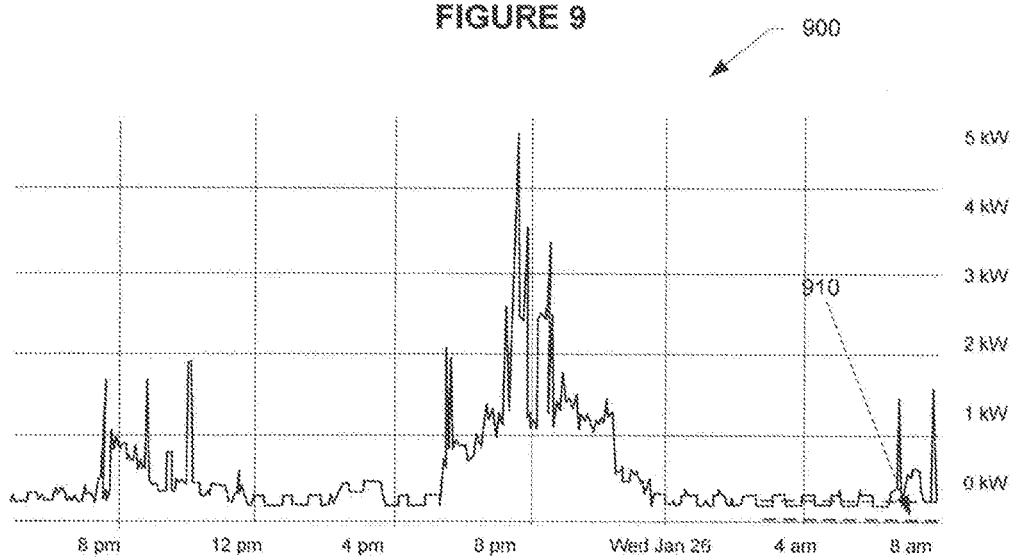
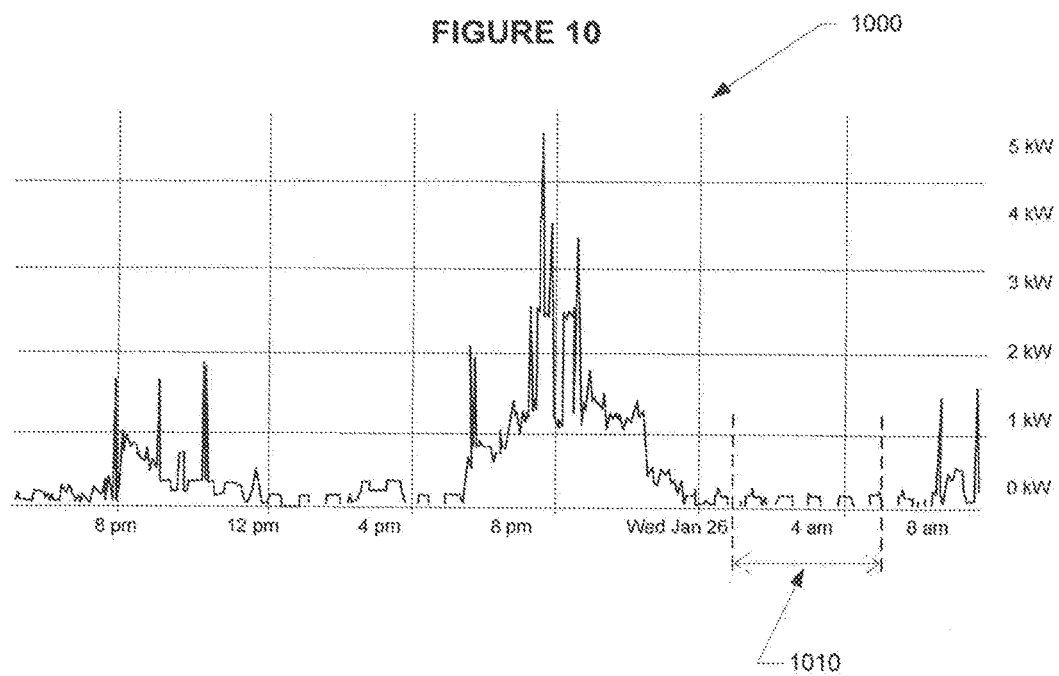

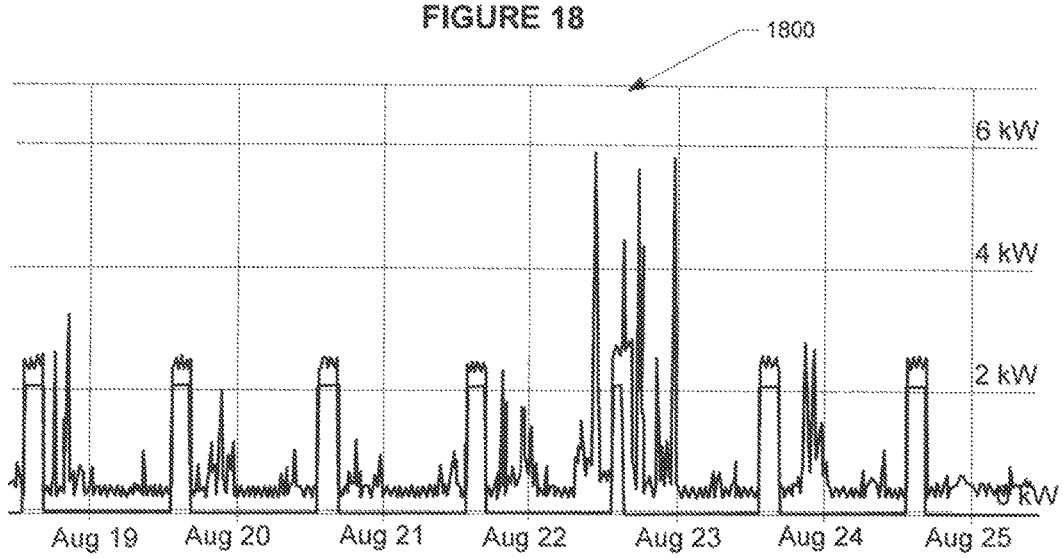
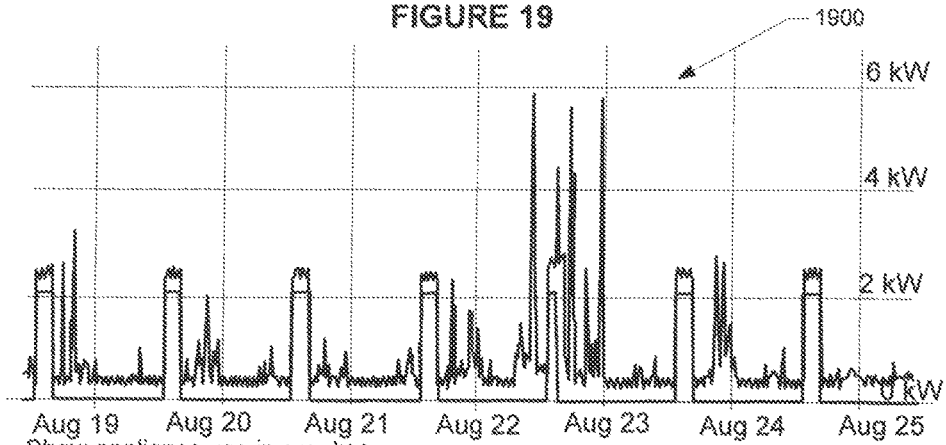

SYSTEMS AND METHODS FOR IMPROVING THE ACCURACY OF APPLIANCE LEVEL DISAGGREGATION IN NON-INTRUSIVE APPLIANCE LOAD MONITORING TECHNIQUES

RELATED APPLICATIONS

This application claims priority to U.S. Provisional Patent Application No. 61/439,826 entitled Use of Non-Electrical Information as input and Other Simplistic Techniques to improve the accuracy of appliance level disaggregation in Non-Intrusive Appliance Load Monitoring (NIALM) Techniques, filed on 4 Feb. 2011; U.S. Provisional Patent Application No. 61/485,073 filed entitled Methods of Obtaining User Feedback to Validate and Improve the Non-Intrusive Appliance Load Monitoring (NIALM) Result, filed on 11 May 2011; and U.S. Provisional Patent Application No. 61/542,610 entitled Use of parameterized finite state machine models to detect and extract individual appliance signatures and instances from the load profile data in Non-Intrusive Appliance Load Monitoring, filed on 3 Oct. 2011. Each of these applications is incorporated herein by reference in their entirety.

BACKGROUND OF THE INVENTION

The present invention is generally directed to systems and methods of non-intrusive appliance load monitoring ("NIALM"). Specifically, the present invention is directed to demand side management for residential and small commercial electric energy usage, utilizing software analytics on whole house load profile data to disaggregate into individual appliances and loads.

Appliance load monitoring is an effective way to communicate to users the amount of energy usage required by various appliances. Presenting users with such information in an understandable format allows users to take appropriate action to actively reduce total energy consumption. Moreover, providing itemized information per specific appliance also permits users to determine if acquiring a new or replacement appliance (for example, through purchase, lease, or rental) would reduce energy costs sufficient to validate the price of purchase, lease, or rental. NIALM enables the breakdown of electricity usage for a property without entering the property or applying any sub-metering devices on the individual appliances/devices/loads inside the property. In general, NIALM is known in the prior art. For example, U.S. Pat. No. 4,858,141 to Hart et al. ("Hart") discusses basic techniques for performing NIALM. Hart teaches generating and using appliance load signatures to extract information for individual loads from whole property load profile data measured by the utility meter. As taught by Hart, information extracted from the utility meter may comprise: power consumption; times when the appliance/load was turned on and off; and appliance/load health.

There has been research in the area of NIALM and various papers have been published on techniques used to define load signatures and run pattern recognition algorithm on the load profile of the property under inspection. Typically, a software analysis is performed on past data collected Therefore such prior art techniques may be useful in breaking down the energy usage or itemizing the electric energy bill post-consumption, but fail to provide near real-time information that may immediately empower users to modify their energy usage. With regard to appliances such as heating or air conditioning—for which usage is based upon immediate conditions—such data of previous usage may provide limited assistance in modifying present behavior and usage.

While the prior art may teach various devices for monitoring and determining power usage (for example, U.S. Patent Application Publication No. 2009/0045804 to Durling et al. ("Durling")), such devices generally require additional components to be installed or specific devices to be utilized. In addition, prior art techniques and devices have drawbacks in that such devices and techniques generally provide a relatively low confidence level of identifying specific appliances. Such techniques and devices typically do not utilize the most knowledgeable party—the user himself—and also generally fail to account for additional non-electrical information that may be available.

Moreover, prior art techniques and methodologies may provide users with some basic information regarding their power consumption—but fail to provide the user with any additional advice or counseling as to how to effectively use the information to reduce energy consumption. Rather, the user is left with the notion that he or she should simply use particular appliances less often. This information is relatively meaningless with regard to appliances that users generally must use—for example, refrigerators, electric ranges, washing machines, dryers, etc. In addition, with regard to economic efficiency, the time of energy usage may dictate the cost of such usage. For example, during peak energy usage times, utility companies may charge increased rates than during low usage times. Merely changing the time of day a particular appliance is used may result in significant cost savings.

Accordingly, it is desirable to provide systems and methods that may educate users of the various ways in which energy usage—and the resulting costs—may be reduced. It is also desirable that such systems and methods utilize non-electric data (such as weather data, time of day data, neighbor usage, users skill, user education, social priorities, house specific information like size, etc.).

SUMMARY OF THE INVENTION

Aspects of the invention may include systems for detecting individual appliance energy loads from a whole house composite load profile, comprising: a transitions generator, that receives the whole house composite load profile and identifies transitions within the whole house composite load profile; a detector in selective communication with the transitions generator, that receives transitions from the transitions generator and determines a household specific appliance state machine for each appliance in the household; and a solver in selective communication with the detector, which receive as input the transitions identified by the transitions generator and the household specific state machines from the detector, and assigns each transition to a household specific appliance state machine, thereby disaggregating the whole house composite load profile into individual appliance energy loads.

Aspects of the invention may further comprise methods for creating an appliance signature based upon a whole house composite load profile, comprising: identifying primitive elements comprising transients and absolute steady state levels; combining primitive elements to form impulses, using multi-dimensional clustering to group primitive elements along multiple dimensions; combining impulses to form simple bundles; combining simple bundles with other simple bundles or with impulses to form complex bundles; and determining, based upon the complex bundles, specific appliance signatures that substantially match the complex bundles, and identifying the specific appliance signatures from the whole house composite load profile.

Aspects of the invention may further comprise methods for detecting individual appliance energy loads from a whole house composite load profile, comprising: determining transitions within the whole house composite load profile; determining household specific appliance state machines for each appliance in the household; and disaggregating the whole house composite load profile into individual appliance energy loads by assigning the determined transitions to the determined household specific appliance state machines.

Additional aspects of the invention may comprise methods of disaggregating a whole house composite load signal from a household into appliance level information, comprising: receiving the whole house composite load signal from a metering device; producing electrical and non-electrical signatures of appliances present in the household based upon the whole composite load signal and selective communication with an electrical signal repository and a non-electrical signal repository; generating a household specific signature using the produced electrical and non-electrical signatures; determining disaggregated individual appliance load information based upon the whole house composite load signal and the household specific signature.

Additional aspects of the invention may comprise methods of incentivizing users to replace inefficient appliances with efficient appliances based upon energy usage data measured from the user's specific inefficient appliances, comprising: determining an appliance load signature from the user's specific appliance, determined from a whole house composite load signature; determining an appliance signature from an alternative appliance; and presenting to the user the difference in energy usage and associated costs between the user's specific appliance and the alternative appliance.

These and other aspects will become apparent from the following description of the invention taken in conjunction with the following drawings, although variations and modifications may be effected without departing from the spirit and scope of the novel concepts of the invention.

BRIEF DESCRIPTION OF THE DRAWING

The present invention can be more fully understood by reading the following detailed description together with the accompanying drawings, in which like reference indicators are used to designate like elements. The accompanying figures depict certain illustrative embodiments and may aid in understanding the following detailed description. Before any embodiment of the invention is explained in detail, it is to be understood that the invention is not limited in its application to the details of construction and the arrangements of components set forth in the following description or illustrated in the drawings. The embodiments depicted are to be understood as exemplary and in no way limiting of the overall scope of the invention. Also, it is to be understood that the phraseology and terminology used herein is for the purpose of description and should not be regarded as limiting. The detailed description will make reference to the following figures, in which:

FIG. 6 depicts frequency spectrum of quantized transition levels from household load profile. Household Specific Appliance Amplitude transition power, duration and Frequency/Periodicity Detection Mechanism.

FIG. 7 illustrates a graph depicting measured household specific appliance amplitude transition power and frequency/periodicity, in accordance with some embodiments of the present invention.

FIG. 9 depicts an exemplary load profile data of a refrigerator in accordance with some embodiments of the present invention.

FIG. 10 depicts an exemplary load profile data of a refrigerator with the always on data removed from the profile, in accordance with some embodiments of the present invention.

FIG. 18 shows an example of an interactive chart allowing users to retag or untag systems detected and classified patterns, in accordance with some embodiments of the present invention.

FIG. 19 shows an example of an interactive chart where a user has untagged an appliance previously classified by systems in accordance with some embodiments of the present invention.

Figure 1:
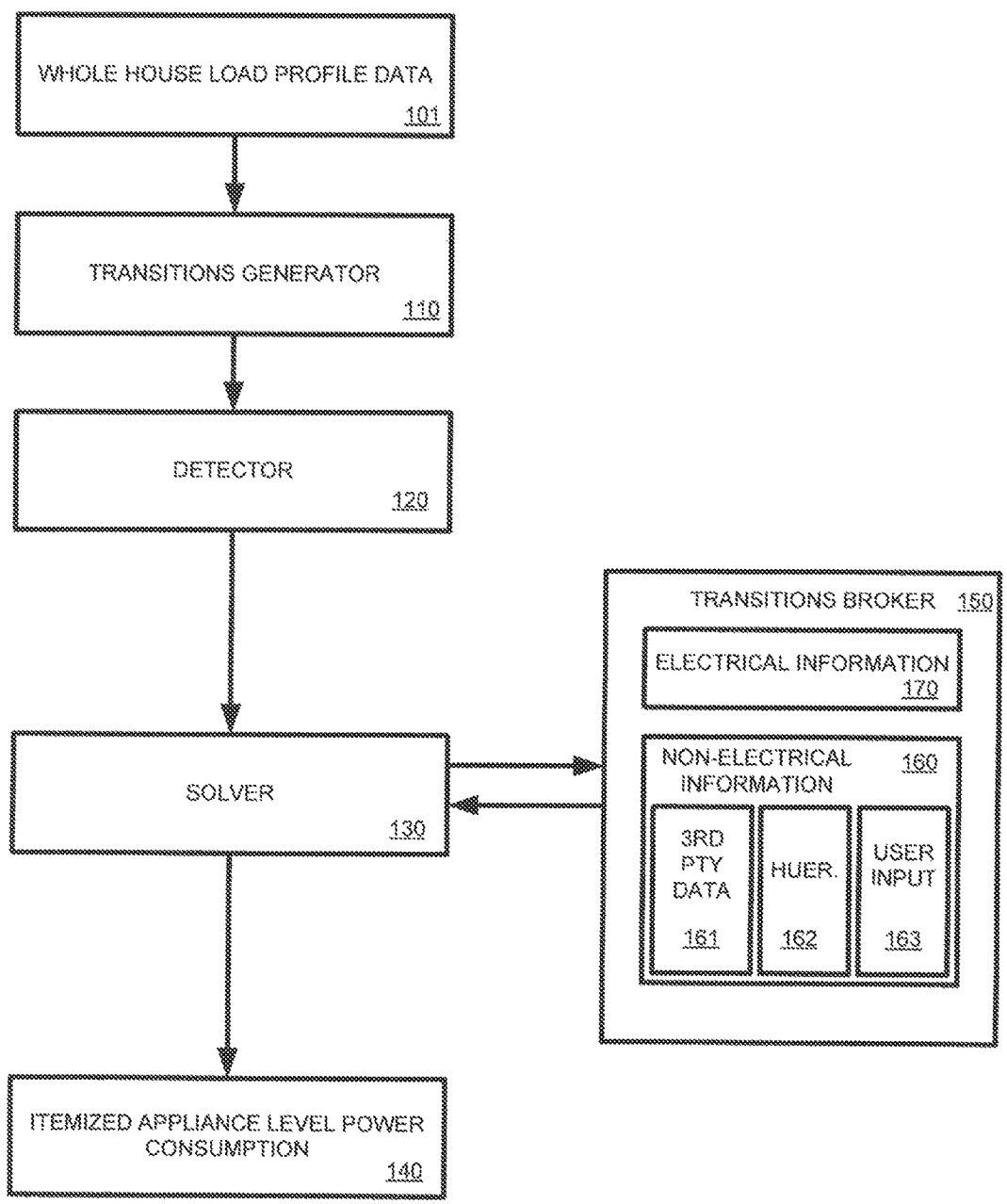
FIG. 1 depicts a system for breaking raw load profile data into an itemized appliance power consumption, in accordance with some embodiments of the present invention.

Before any embodiment of the invention is explained in detail, it is to be understood that the present invention is not limited in its application to the details of construction and the arrangements of components set forth in the following description or illustrated in the drawings. The present invention is capable of other embodiments and of being practiced or being carried out in various ways. Also, it is to be understood that the phraseology and terminology used herein is for the purpose of description and should not be regarded as limiting.

DETAILED DESCRIPTION OF THE INVENTION

The matters exemplified in this description are provided to assist in a comprehensive understanding of various exemplary embodiments disclosed with reference to the accompanying figures. Accordingly, those of ordinary skill in the art will recognize that various changes and modifications of the exemplary embodiments described herein can be made without departing from the spirit and scope of the claimed invention. Descriptions of well-known functions and constructions are omitted for clarity and conciseness. Moreover, as used herein, the singular may be interpreted in the plural, and alternately, any term in the plural may be interpreted to be in the singular. Reference figures preceded with "S" (e.g., S100) indicates a step.

Note that while the preceding and following disclosure primarily discusses monitoring and reporting electric usage, it is fully contemplated by the applicants that such systems and methods disclosed herein may also be used to monitor other types of energy consumption—for example natural gas, propane, and water consumption.

Note that while the terms used in this document should be read in accordance with common usage, note that the following information may be used to assist in the understanding of such terms.

"Electrical signals" may comprise steady state or transient information for various appliances when such appliances are turned on or off.

The term "load profile" is generally used to indicate steady state power information—that is, real power usage in kilowatt hours (kWh) or reactive power in kilovolt-amperes (KVA).

"Non-electrical signals" may comprise information about an appliance that is not based upon direct usage, but rather behavior related—for example but not limited to—duration, frequency of use, weather conditions, family size, geographic locations, etc The term "retagging"/"retag" is generally used as shorthand for an input a user may provide to a system when a user reclassifies a pattern from a specific appliance—as initially determined by the system—to a different appliance.

The term "tagging"/"tag" is generally used as shorthand for an input a user may provide to a system in order to classify a pattern into a specific appliance.

The term "transients" is generally used as shorthand for high frequency data sampled over a short period of time (ranging, for example, from a few milliseconds to a few microseconds).

The term "untagging"/"untag" is generally used as shorthand for an input a user may provide to a system in order to declassify a pattern from a specific appliance, as initially determined by the system.

With reference to FIG. 1, the basic components in the system 10 of algorithmic detection of individual appliances from the whole house composite load profile will now be discussed. The system 10 generally comprises a transitions generator 110, a detector 120, a solver 130, and a transitions broker 150.

The transition generator 110 receives the raw load profile 101, for example, from a metering or measuring device that captures a whole house composite load profile. Such devices are discussed in greater detail below. The transitions generator 110 takes in the raw data input and generates the transitions after cleaning up the noise from the raw data. This information is then passed to the detector 120.

Specifically, the transitions generator 110 may utilize at least two (2) pieces of information as input: (i) the raw whole house composite load profile, which may be available as a list of tuples, such as "time-stamp, load"; (ii) the sampling frequency at which the raw data has been collected (the "interval"); and (iii) the window size used to detect stabilization of a power level (the "noise length") that is applied before generating transitions in a specific level.

The transitions generator 110 may utilize an algorithm that maintains a range of power levels in a certain noise length window. The noise length window may consistently slide forward in time—by processing one sample at a time—and the maximum and minimum power levels within each window may be computed. If the maximum and minimum power levels within each window are within the allowable noise margins, the power level is considered to be stabilized. The stabilized power level is then compared with the previous, or last known stabilized power level. If the difference between these two values is greater than the allowable noise margin, then it is determined that a change power level—or a transition—has occurred. This transition is time-stamped and recorded. The amplitude of the transition is the amplitude of the change in power levels. This amplitude may be positive or negative depending on whether the power level increased or decreased.

The new stabilized power level may now be saved as the last known stabilized power level in order to repeat the process with the next window. In this manner, a running list of transitions, represented in the tuple ("time-stamp, change in power level") may be created.

The detector 120 determines the household specific appliance state machine for each appliance in the household and sets forth the state machine for each appliance. This data is then input to the solver 130. The detector 120 uses various algorithms for each appliance category. For example, the algorithm applied to a clothes dryer in order to determine the state machine may be different than the algorithm that may be applied to an air conditioner.

The specific operation is discussed in greater detail below. The solver 130 may receive as input all of the household specific state machines for appliances determined to be operating in the household, and process such state machines through the transitions generated from the whole house composite load data. The solver 130 may be in selective communication with the transitions broker 150.

Specifically, the solver 130 disaggregates various transitions into specific state machine appliances. The solver 130 receives as input (i) a list of determined transitions; and (ii) a list of state machine definitions (that is, data identifying various state machines).

The solver 130 may create a list of "active" devices for appliances that are in the "on" state and using non-zero energy. Each transition received from the detector 120 may then be tested against each "active" device state machine to determine if the transition can be accepted by any of the identified appliances that are currently using energy. All identified state machines are then moved to the next state. In addition, each transition is tested with each "non-active" device state machine to see if the transition corresponds to any of the devices turning "on". If such transitions are identified, these transitions are moved from their initial state into the "active" list. Each identified state machine then keeps track of each transition it accepts, along with its date stamp.

Once all transitions are assigned, the result may be a list of state machine instances that are now in their final state. This information may be used disaggregate the whole house composite load data.

The transitions broker 150 may be used to appropriately assign transitions to the proper appliance when the transition may represent different appliances. The transitions broker 150 may apply intelligent logic in order to assign each transition detected to one of the identified appliances.

The transitions broker 150 performs an important task in that determines how to assign transitions where more than one state machine can accept the transition. Because each change in power level is associated with one and only one appliance, it may be necessary to police the allocation of transitions to verify that the proper state machine receive the proper transition.

The transitions broker 150 may perform this function by using one or more policy rules. Policy rules may include the following.

(a) If there is an "active" state machine and a "non-active" state machine that can both accept a transition, the "active" state machine has priority.

(b) If a transition is equally applicable to two or more state machines, the more "complex" appliance gets the priority. Different appliances have state machines with varying degrees of complexity. A complexity index may be assigned to each appliance and this index may be used by the transitions broker 150 to properly assign transitions.

(c) If the transitions broker 150 has to assign the same transition to multiple state machines, the transitions broker 150 may monitor each state machine and eventually commit to one state machine by inserting a "duplicate transition map" that contains the transitions as the key and the list of potential state machines as the value, for example, T→{SM1, SM2, SM3}. This map may be continuously compiled. However, when any state machine reaches its "final" state, the transitions broker 150 may then traverse all of the accepted transitions and remove all other state machines that may have accepted any of the transitions assigned to the state machine that went "final." Duplicate transitions that were accepted by the "final" state machine are then deleted from the "duplicate transition map."

In applying its rules, the transitions broker 150 may be in selective communication with a variety of non-electrical information 160, which may be utilized to assist in properly assigning the transitions to the appropriate appliances. For example, non-electrical information 160 may comprise third party data 161, various heuristics 162, and information gathered from various user input 163.

Third party data 161 may include information collected from other sources—such as tax information (providing the square footage of a home), temperature data (providing heating and/or cooling degree days), neighborhood data (providing average use for the specific area), etc. Various heuristics 162 may comprise general rules of thumb, for example, that one is unlikely to be running a clothes dryer between 2:00 AM and 5:00 AM, or that cooking ranges are often used between 6:00 AM to 9:00 AM and from 4:00 PM to 8:00 PM. User input data 163, which is discussed in greater detail below, may provide information from various users as to whether the appliance to which the transitions are assigned by the solver is correct. Note that this information may be provided by various users and may be compiled into a database of sorts, and accordingly may be used by the system for all users—not just the users who provide input.

Note that detection of the proper state machine for whom to assign a transition may be improved through the use of machine learning techniques. For example, the finite state machines generated for an appliance in the detection phase may comprise a number of parameters as described in earlier sections. While fewer parameters may lead to simpler state machines, fewer parameters generally causes a higher error rate of proper transition assignment. Accordingly, in order to improve the accuracy of the generated finite state machines, it is desirable to assign as many parameters as possible.

For example, the parameters defining an air conditioning state machine may include: (i) the "on" slew rate (that is, the time taken for the air conditioning transition to reach stable utilization state when it is turned on); (ii) the "off" slew rate (that is, the time taken for the air conditioning transition to reach stable utilization state when it is turned off); (iii) the range of duration of energy pulses required by the air conditioning; (iv) the interval between subsequent pulses; and even (v) weather patterns (for example the quantity of cooling degree days or heating degree days for the relevant geographic location).

Moreover, state machine parameters can be learned from at least two different sample sets: (a) multiple samples from the same house over a period of time, for example (i) the amplitude of the air conditioning usage in the home (thereby characterizing the exact appliance); (ii) the daily usage profile (thereby characterizing the presence of a programmable thermostat and pinpointing transition times); (iii) the periodicity of on/off times as the appliance (for example, air conditioning) runs in cycles may assist in characterizing the weather or insulation characteristics of the home, for example by comparing the outside temperature with the set point inside temperature; and (b) samples from different houses, for example (i) learning about different types of clothes dryer patterns; (ii) temporal usage patterns of microwaves; or (iii) time of year, for example identifying when the air conditioning is typically used based on geographic location.

Moreover, the solver 130 and/or transitions broker 150 described above may utilize such in order to determine whether to accept or reject a particular transition into a finite state machine. Such determinations may be based on a statistical decision function that may be continuously refined with the use of supervised machine learning. Accordingly, it is possible to train the statistical decision function using both manual processes and inputs where the power usage data for the specific type of appliances is collected over time for same house and for many different houses.

Utilizing the transitions detected and assigned by the system 10, an itemized appliance power consumption 140 may be output. This itemized appliance power consumption may provide users with information that identifies specific appliances and their respective energy draws.

Figure 2:
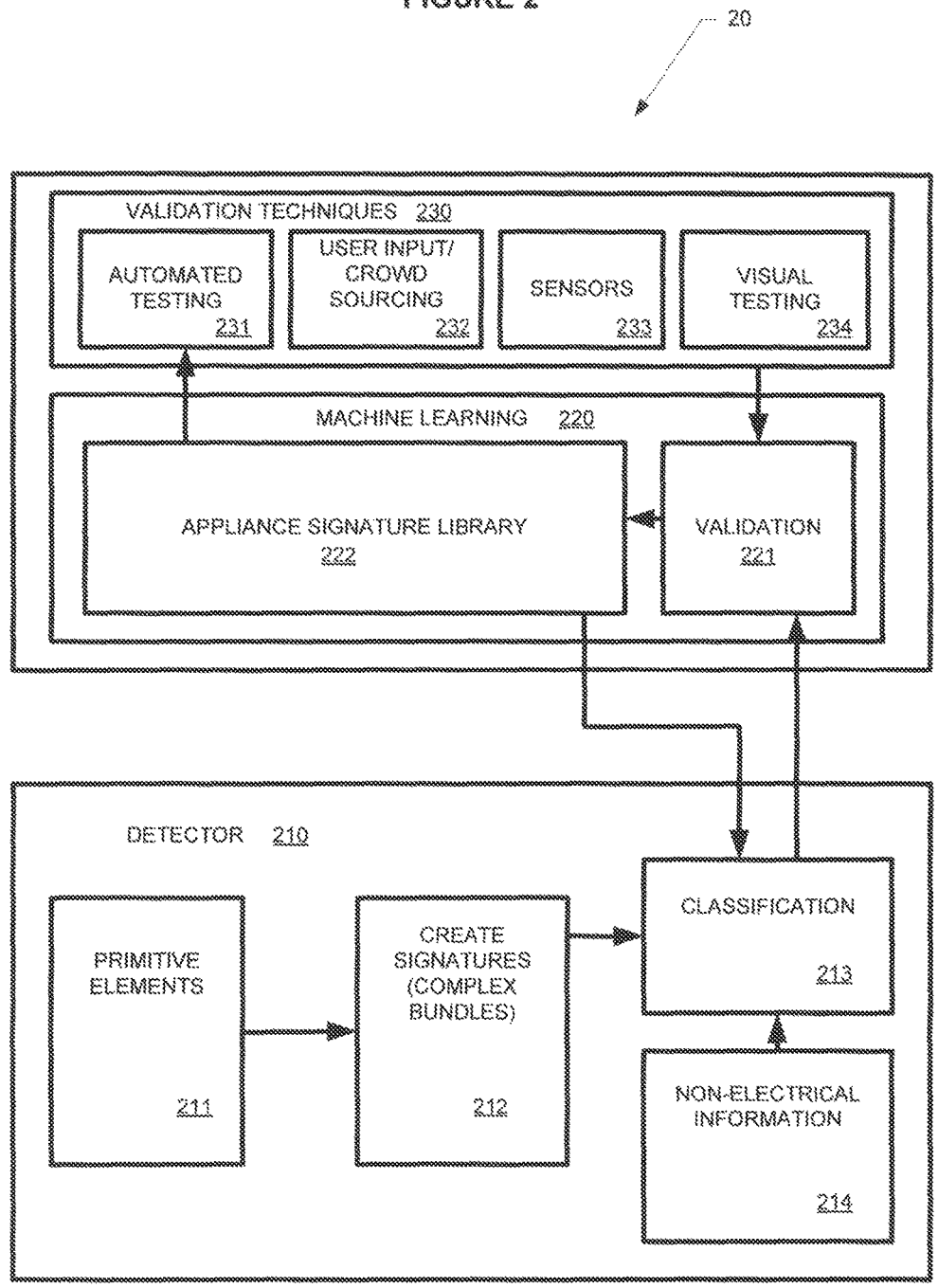
FIG. 2 depicts a detector used in a system for breaking raw load profile data into an itemized appliance power consumption, in accordance with some embodiments of the present invention.

FIG. 2 depicts the detector in more detail. In operation, the detector identifies the signature of appliances through the use of primitive elements, such as transients and absolute steady state levels. The detector creates appliance signatures (complex bundles) from this information. For example, transients can be used to create a signature through the use of multi-dimensional clustering. In multi-dimensional clustering, the primitive elements are clustered along multiple dimensions (for example: amplitude, periodicity, impulse width, time of day, time of week, etc.).

Figure 3:
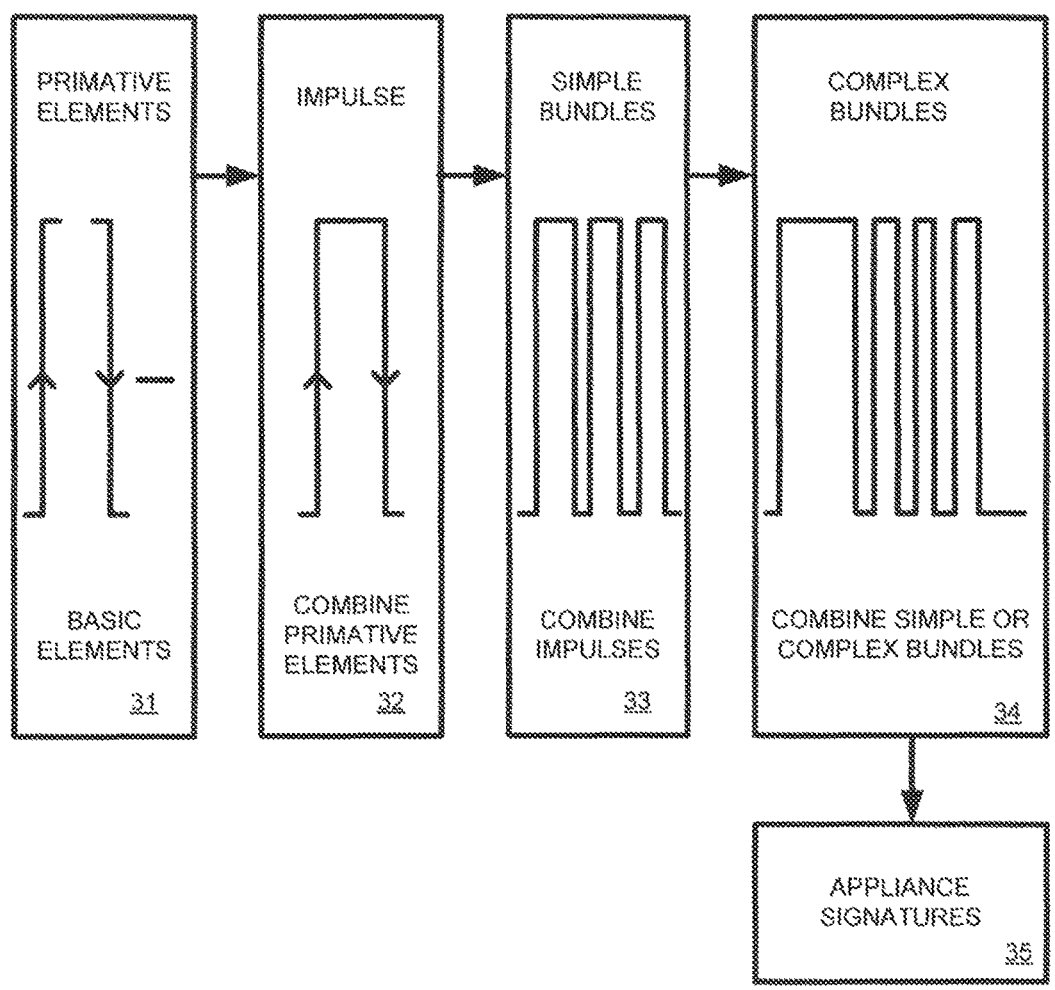
FIG. 3 illustrates various electrical signals and methods for combining such signals into appliance signatures, in accordance with some embodiments of the present invention.

With reference to FIG. 3, an exemplary process, in accordance with some embodiments of the present invention, will now be discussed. Primitive elements 31—for example, a simple up transient, down transient, or steady state level, may be identified. These primitive elements 31 may be combined to create one or more impulses 32. Impulses 32 may then be combined into simple bundles 33—which may, for example, have varying amplitude or periodicity. Impulses 32 and simple bundles 33 may be combined in various ways to create complex bundles 34. In general, complex bundles 34 may contain adequate information to represent a signature or template of an appliance. The complex bundles 34 created from such an analysis of transients for any home power data can therefore be used to classify the usage as a particular appliance.

With renewed reference to FIG. 2, the primitive elements 211 are used to create signatures 212 (or complex bundles). Such signatures 212 or complex bundles are then classified by the classification module 213, for example using state machine models. Note that the classification module 213 can utilize non-electrical information 214—discussed both above and below in greater detail—in classifying the appliance and energy usage.

An additional part of the system 20 that permits more accurate and efficient results is the ability of the system 20 to learn, using machine learning component 220 in order to make the classification of appliances better over time. In general, such machine learning both builds and draws upon an appliance signature library 222. Appliance signature library 222 may store appliance signatures after successful classification, and may include other parameters, for example the relevant zip code, weather, user information, house information and/or any other information that may contribute to the appliance use or signature.

Each time a signature is classified into an appliance, such classification may be passed to a validator 221 which performs validation 230 on the classification. The validation 230 may use various validation techniques in order to create a confidence level for the appliance signature. For example, the classification may be validated through automated testing 231, user input/crowd sourcing input 232, various sensors on various appliances 233, and/or visual testing 234. Classifications and signatures that receive a high confident level may then be written into the appliance signature library 222, in order to prevent unnecessary duplication of the effort in identifying the signature. Therefore, the appliance signature library 222 may be used to classify complex bundles into specific appliance signatures.

Use of Non-Electrical Information as Input to Improve the Accuracy of NIALM

Figure 4:
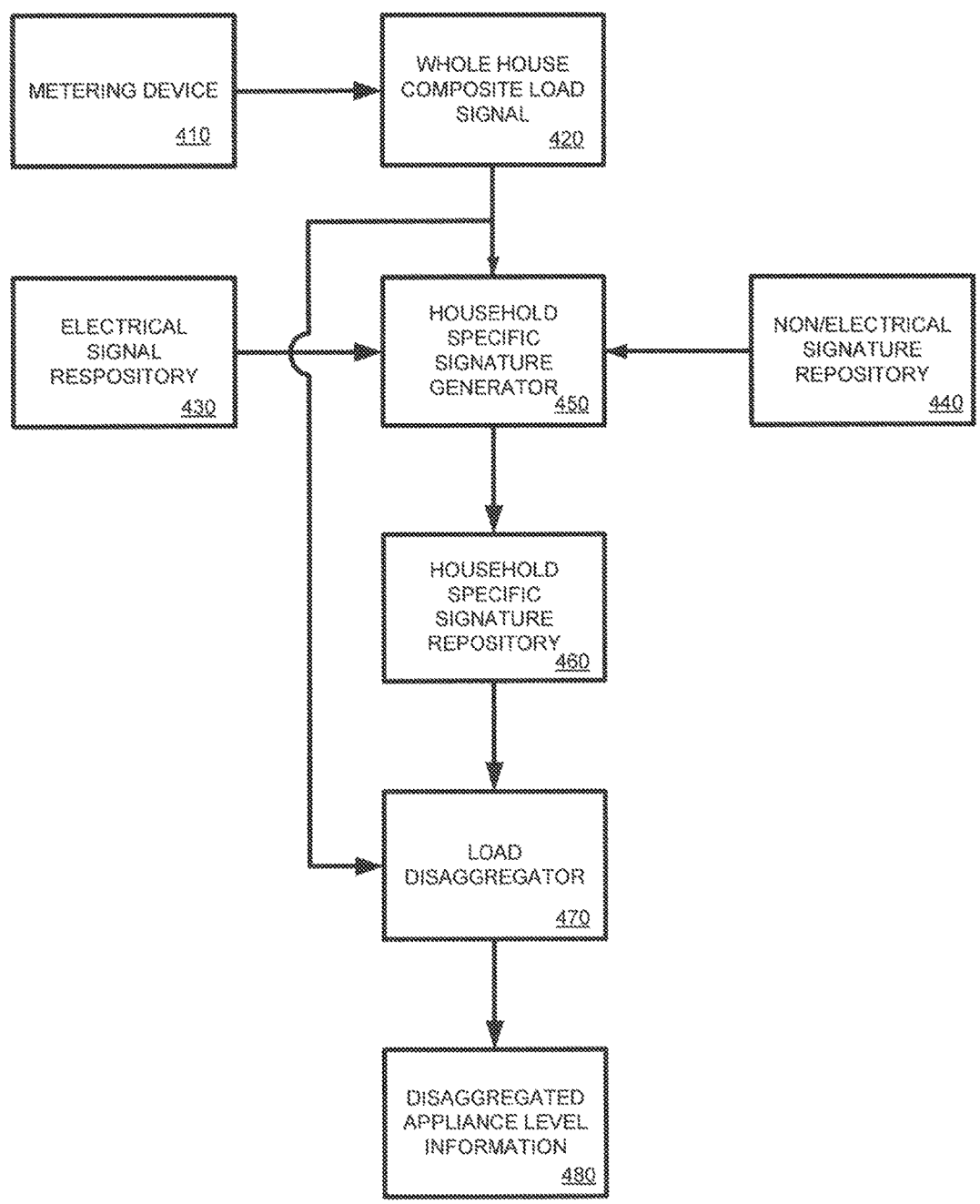
FIG. 4 depicts a system in which household specific appliance load signatures are generated in accordance with some embodiments of the present invention.

With reference to FIG. 4, a system 400 of improving the accuracy of appliance level disaggregation in non-intrusive appliance load monitoring techniques will now be discussed. The system 400 may comprise a metering device 410, an electrical signature repository 430, a non-electrical signature repository 440, a household specific signature generator 450, a household specific signature 460, and a load disaggregator 470.

The metering device 410 may comprise a device that measures the energy usage of a household. The metering device may be automatically report such usage to the utility, or may not possess communication capabilities. The metering device 410 may comprise a Smart Meter or a clamp-on energy meter, such as The Energy Detective ("TED") 5000 or the PowerCost Monitor offered by Blue Line Innovations. However, it is contemplated that metering device 410 may alternatively comprise any device capable of monitoring, measuring, and capturing customer energy usage based upon particular sampling rates. The metering device 410 may record a composite signal for the whole house 420 (i.e., the active power, reactive power and voltage used by the customer), and may transmit such data back to the utility provider or to a third party.

Figure 5:
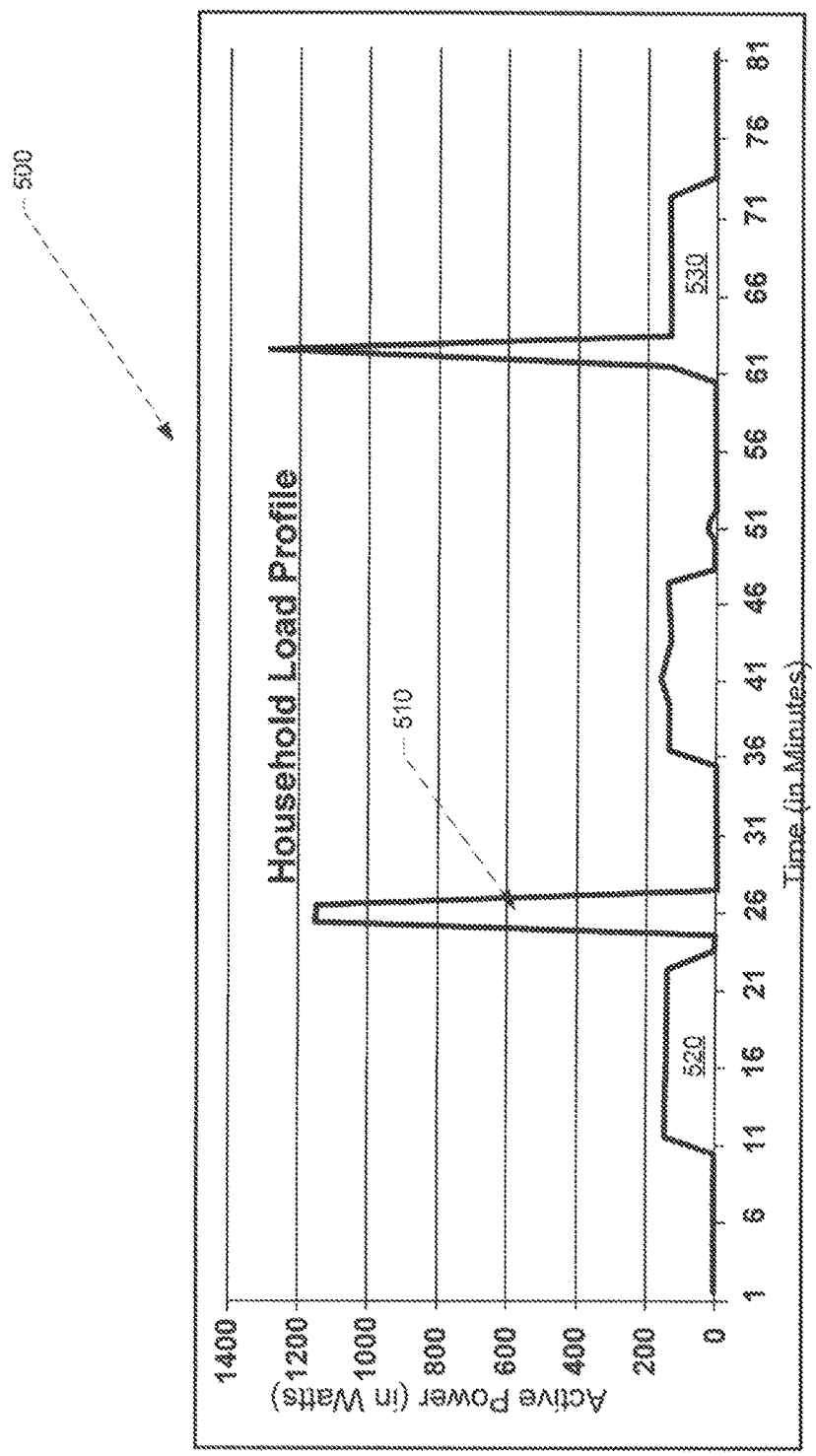
FIG. 5 illustrates a sample household load profile with multiple loads overlapped, in accordance with some embodiments of the present invention.

An exemplary whole house composite load signal 420 is depicted in FIG. 5, and discussed in greater detail below. The transmission of the whole house composite load signal 420 may be accomplished by any means of communication known in the art, for example but not limited to the smart grid/advanced metering infrastructure network, cellular communications (e.g. 3G or 4G networks), radio frequency mesh networks, power line carrier networks, or other such networks (e.g., Ethernet, coaxial networks, T1 lines, etc.).

With renewed reference to FIG. 4, the electrical signature repository 430 may comprise a database that contains electrical load signature patterns of common appliances used in residential and commercial locations. Each electrical load signature may comprise information regarding the range of real (active) and reactive power the specific appliance consumes at start-up, shut-down, and during various states during the operation of the appliance. For example, running a 100 watt incandescent light bulb consumes one-hundred (100) watts of real power, and zero (0) volt-amperes of reactive power at startup, maintains the same power consumption while the light bulb is being used, and consumes negative one-hundred (−100) watts of real power at shut-down.

In contrast, the power consumption of a dishwasher is more complicated. A dishwasher may have a specific load pattern at start-up and shut-down, but may have multiple operating states during operation. For example, the energy requirements during wash, rinse, sanitize, and dry may be different. The electrical signature repository 430 may comprise data representing the energy consumption of the dishwasher in each of the mentioned cycles, and may also comprise data representing the change in energy as the dishwasher moves from one state to another.

For example, the Table T-1 below illustrates electrical load signatures that may be present in the electrical signature repository 430.

TABLE T-1

| Appliance | Appliance States | Active Power (W) Range | Reactive Power (VA) Range |
| --- | --- | --- | --- |
| Refrigerator | State 0 (S0) - Off | 0 | 0 |
| | State 1 (S1) - Compressor On | 150-250 | 150-250 |
| | State 2 (S2) - Once a day | 400-600 | 10-100 |
| Microwave | State 0 (S0) - Off | 0 | 0 |
| | State 1 (S1) - On | 900-1700 | 200-500 |
| Electric Clothes Dryer | State 0 (S0) - Off | 0 | 0 |
| | State 1 (S1) - High Heat | 4500-6500 | 200-400 |
| | State 2 (S2) - Cool Down | 200-300 | 200-400 |

The non-electrical signature repository 440 may comprise non-electrical data that may be used to identify particular appliances. For example, non-electrical signature repository 440 may comprise behavioral information regarding typical use patterns of appliances, weather data, census data, etc.

With regard to behavioral information, non-electrical signature repository 440 may comprise data related to periodicity/frequency, duration, use time of day, use day of week. Exemplary information is set forth below in Table T-2.

TABLE T-2

| Appliance | Periodicity/Frequency | Typical Duration | Time of the Day/Week |
|---|---|---|---|
| Refrigerator | Approximately once every hour | 5 min.-30 min. per hour. | 24 hours/day; 7 days/week. |
| Microwave | None | 10 sec. to 10 min. | Higher probability during mornings and evenings. |
| Electric Clothes Dryer | None | 30 min. to 75 min. | Higher probability during weekends. |

Periodicity/frequency data may set forth frequencies that a specific appliance is used. This information can help distinguish, for example, a pool pump that typically runs once a day from a refrigerator which generally runs its compressor once an hour. Duration data may set forth typical duration times of specific appliances. For example, the pool pump discussed above may run for anywhere from three (3) to six (6) hours a time. In contrast, the refrigerator compressor may run between five (5) and thirty (30) minutes a time.

Time of day data may be also be utilized in determining the energy requirements of specific appliances. For example, it is unlikely to run a dishwasher or clothes washer between the hours of 1:00 AM to 4:00 AM, but a refrigerator compressor will continue to operate during such times. Similarly, a cooking range is more likely to be used between 5:00 PM to 9:00 PM as opposed to 12:00 AM to 5:00 AM.

Time of week (or day of week) can also be utilized. For example, clothes washers and dryers are more likely to run consistently on weekends (i.e., Saturday or Sunday) rather than weekdays. Pool pumps and refrigerators are generally unaffected by days of the week.

The system 100 of improving the accuracy of appliance level disaggregation in non-intrusive appliance load monitoring techniques may also comprise the household specific load signature generator 450. The household specific load signature generator 450 may produce accurate electrical and non-electrical signatures of appliances present in a specific household. As will be discussed in more detail below, the household specific load signature generator 450 receives as inputs the composite load signal of the specific household and through selective communication with the electrical signatures repository 430 and the non-electrical signature repository 440, determines specific appliances in the specific household, thereby outputting the household specific signature 460, including both electrical and non-electrical signatures of appliances present in the specific household.

An exemplary household specific signature 460 is shown below in Table T-3.

TABLE T-3

Electrical Data

| Appliance | Appliance States | Active Power (W) for specific appliance in specific household | Reactive Power (VA) for specific appliance in specific household |
|---|---|---|---|
| Refrigerator | State 0 (S0) - Off | 0 | 0 |
| | State 1 (S1) - Compressor On | 185 | 15 |
| | State 2 (S2) - Once a day | 545 | 15 |
| Microwave | State 0 (S0) - Off | 0 | 0 |
| | State 1 (S1) - On | 1100 | 220 |
| Electric Clothes Dryer | State 0 (S0) - Off | 0 | 0 |
| | State 1 (S1) - High Heat | 5200 | 230 |
| | State 2 (S2) - Cool Down | 250 | 230 |

Non-Electrical Data

| Appliance | Periodicity/Frequency | Typical Duration | Time of Day/Week |
|---|---|---|---|
| Refrigerator | Approximately once per hour | 18 min. (narrowed down from generic signature) | 24 hrs/day; 7 days/week |
| Microwave | None | 10 sec. to 10 min. | Higher probability during morning and evenings. |
| Electric Clothes Dryer | Every week. | 45-55 min. (narrowed down from generic signature) | Most run on Friday evening/Saturdays |

As discussed in more detail below, the load disaggregator 470 receives as input the whole house composite load signal 120 and the household specific signature 460. The load disaggregator 470 utilizes these two inputs to produce disaggregated individual appliance load information 480.

In use, the exemplary system 400 of improving the accuracy of appliance level disaggregation in non-intrusive appliance load monitoring techniques may generally operate as follows. Metering device 410 may measure and/or record the whole house composite load signal 420, as illustrated in FIG. 5. For example, the whole house composite load signal illustrated in FIG. 5 may represent the combined load signal of multiple appliances. For example, the portion of the graph noted as 510 may be a first appliance, while the portion of the graph noted as 520 may be a second appliance. The portion of the waveform indicated as 530 may represent a combined energy usage of the first and second appliances.

This information may be provided to both the household specific signature generator 450 and the load disaggregator 470. The household specific signature generator 450 may use the whole house composite load signal 420 in addition to data stored in the electrical signature repository 430 and the non-electrical signature repository 440 to determine appliances running in the household.

Specifically, the household specific signature generator 450 may perform the following steps in order to filter the noise (i.e., undesired electrical disturbance that degrades the useful information in the signal) from the whole house composite load signal 420 and generate the household specific signature 460. Note that while these steps are set forth in an enumerated order, it is fully contemplated by the inventors that the order of these steps may be modified or altered, and that additional steps may be added or listed steps omitted.

(a) Read the whole house composite load signal 420 of the specific household for a predetermined period of time (generally a period, for example one (1) week to three (3) months. An exemplary whole house composite load signal 420 is shown in FIG. 2.

(b) Detect periodic load patterns from the whole house composite load signal 420. In some embodiments, the periodicity detection for simple on-off appliances may be performed as follows:

(i) Find all transitions—a shift in power consumption between two successive load samples above a certain noise threshold—from the whole house composite load signal 120. In other words, if the whole house composite load signal 420 shows a total power consumption change from 100 W to 122 W, there is a transition of +22 W.

(ii) Quantize measured transitions to a particular level, for example to 20 W levels. In other words, transitions measured from 120 W to 139 W may be quantized to 120 W.

(iii) For each transition level, analyze its occurrence in the frequency spectrum. For example, quantizing measured transitions to 20 W levels from the whole house composite load signal depicted in FIG. 5 and analyzing the transition frequency is graphically illustrated in FIG. 6. FIG. 6 shows a transition of −1150 W (indicated at 610) with a matching transition of +1150 W (indicated at 611), as well as a transition of −135 W (indicated at 620) and a matching transition of +135 W (indicated at 621). Note that the transition of −1150 W and +1150 W occurred twice in the whole house composite load signal shown in FIG. 5, while the transition of −135.

(c) For each transition level and for each occurrence of such transition level in the whole house composite load signal 420, identify a matching negative transition closest to it in a temporal sense (i.e., timeline). Once matching negative transitions have been identified, determine the duration of the particular level of power consumption.

(d) Using the measured usage and amplitude, and determined periodicity and duration, create output table setting forth the data regarding each transition level. An exemplary output table 700 is set forth in FIG. 7, in which amplitude 710, duration 720, and periodicity 730 are indicated.

(e) For each appliance detected in the output table, inspect each "triplet,"—transition level, frequency, and duration—in order to confirm each is in accordance with data listed for any appliance category in both the electrical load signature repository 430 and the non-electrical load signature repository 440. If each triplet matches data in both repositories 430, 440, then it is determined that the triplet represents an actual appliance used in the household. Therefore, the identified appliance is added to the household specific load signature 460.

(f) Once one or more appliances are identified, their occurrences can be subtracted from the whole house composite load signal in order to simplify the iterative process for remaining unidentified appliances. As the process continues, appliances that were initially difficult to identify can be easily and efficiently identified from the remaining data.

(g) The household specific signature generator 450 completes and outputs a household specific signature 460 to the load disaggregator 470.

The load disaggregator 470 receives as inputs the whole house composite load signal 420 and the household specific signature 460, and produces a disaggregated individual appliance load information. The load disaggregator may run in real or near real time, such that data is available within minutes of actual power usage. Specifically, the load disaggregator may continuously read continuous whole house composite load signal 420 (rather than just the sampling period as discussed above when generating the household specific signature), and may generate quantized transition levels. As new transition levels are identified, such newly identified transition levels may be matched against the household specific signature in order to determine if the transition level matches any identified appliance. The end result this process disaggregated individual appliance load information.

Note that in some embodiments, the matching of transition levels to specific appliances may further comprise the use of genetic algorithms, dynamic programming, or clustering algorithms. For example, in a cluster analysis, frequently occurring transitions are assumed to be the result of an appliance being used. Accordingly, the number of clusters identified generally indicates the frequency of the use of an appliance. Characteristic changes in the measurements associated with each cluster may be used identify the specific appliance. Cluster analysis directed at NIALM techniques are discussed in U.S. Pat. No. 4,858,141.

Many variations in the above-discussed systems and methods for generating household specific appliance load signatures are contemplated by the inventors. For example, although the systems and methods discussed above are most efficient and effective when using data based upon a particular sampling rate (for example, one (1) second), it is contemplated that such systems and methods may be modified to provide disaggregation based upon larger sampling rates—for example based upon the fifteen (15) minute rate currently utilized by most Smart Meters. In addition, it is contemplated that the systems and methods discussed in the present invention may be utilized to apply such analytics to existing data already collected by utilities—for example by manually recording data from non-Smart Meter meters.

It is also contemplated that in order to obtain and report data, Smart Meters may download a thin third party application layer that stores transition data at a configurable sampling frequency and reports such data to the utility (or a third party) using the reporting frequency determined and set by the utility (for example, once or twice per day). Alternatively, it is contemplated to modify a configuration parameter set of a Smart Meter such that the Smart Meter would sample energy data at a set desired sampling frequency and report such data to a utility and/or a third party.

Detecting Individual Appliance Power Consumption Using Low Computation and Memory Requirement Software Analytics With reference to FIG. 8, an exemplary system and method of disaggregating the energy draw of an appliance from a whole house composite load signal, in accordance with some embodiments of the present invention will now be discussed. For simplification purposes only—and without any limitation of the applicability of this section or the invention—the discussion below will discuss the exemplary detection of a refrigerator. The methods and processes of such embodiments can easily be used for detecting other appliances and loads.

Figure 8:
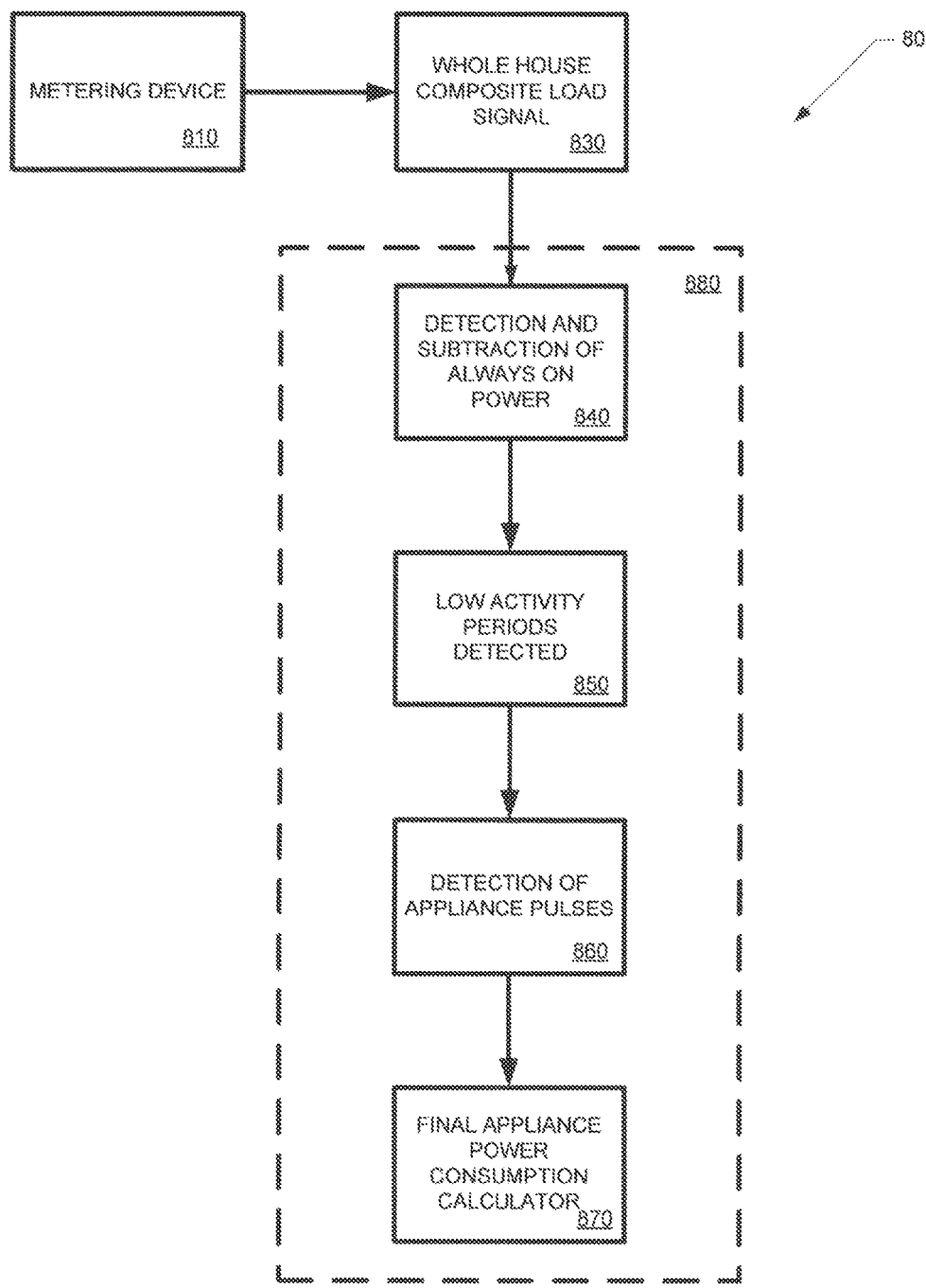
FIG. 8 depicts an exemplary method of disaggregating the energy draw of a refrigerator from a whole house composite load signal, in accordance with some embodiments of the present invention.

With reference to FIG. 8, a system 80 for detecting individual appliance power consumption using low computation and memory requirement software analytics will now be discussed. The system 80 may comprise a metering device 810 that may measure and/or record energy usage and may measure, record, or generate a whole house composite load signal 830; and a processor 880 that may comprise software analytics for disaggregating the whole house composite load signal.

The whole house composite load signal 830 is provided to the processor 880 which may detect always on power loads, and subtract always on power loads from the whole house composite load signal at 840. Some devices/appliances are always on in a household and consume constant amount of electricity. For example, a microwave when not being used to cook, may still draw electricity to power the clock. For such an appliance, the total energy draw for the house is detected, and the "always on" component is isolated.

Specifically, the processor 880 operates an algorithm that receives as input instantaneous power sampled at a particular frequency (for example, one (1) second). The processor receives the whole house composite load signal 830 over a longer period (for example, over thirty (30) days), and quantizes the instantaneous power values and categorizes or "buckets" the power values. For example, all power values in the 0-10 W range, 10-20 W range, and 20-30 W range may be grouped. Once the power values are grouped, data representative of noise are discarded by discarding the power value categories with a low number of samples. Once the noise is eliminated, the next lowest categories—or even a weighted mean of the 5% lowest categories—are identified as always on power. For example, in an exemplary whole house composite load signal 90 in FIG. 9, the always on power 910 is identified. Once the always on power has been determined, it can be subtracted from the whole house composite load signal 90. The resulting load signal is depicted in FIG. 10.

Note that there are periods of time when there are many devices are used that draw energy and other times when such appliances are not in operation and accordingly have little energy usage. Various devices like microwave ovens, laundry washer and dryers, dishwashers, cooking ranges, etc. may be in operation intermittently generally are not used during certain times of day (for example, between 1:00 AM-5:00 AM). Accordingly, the algorithm may review a duration of energy usage (for example, the previous thirty (30) days) and identify times where the overall energy use is minimal. With reference to FIG. 10, such a period of low activity is indicated by reference numeral 1010.

For example, in accordance with some embodiments of the present invention, the algorithm may review a rolling window of three (3) hours, and computes the total energy used during such period. This total energy usage may be computed every five (5) successive minutes. Once each five minute increment has been computed for the entire period of data input, each period that has minimum power consumption is identified.

Figure 11:
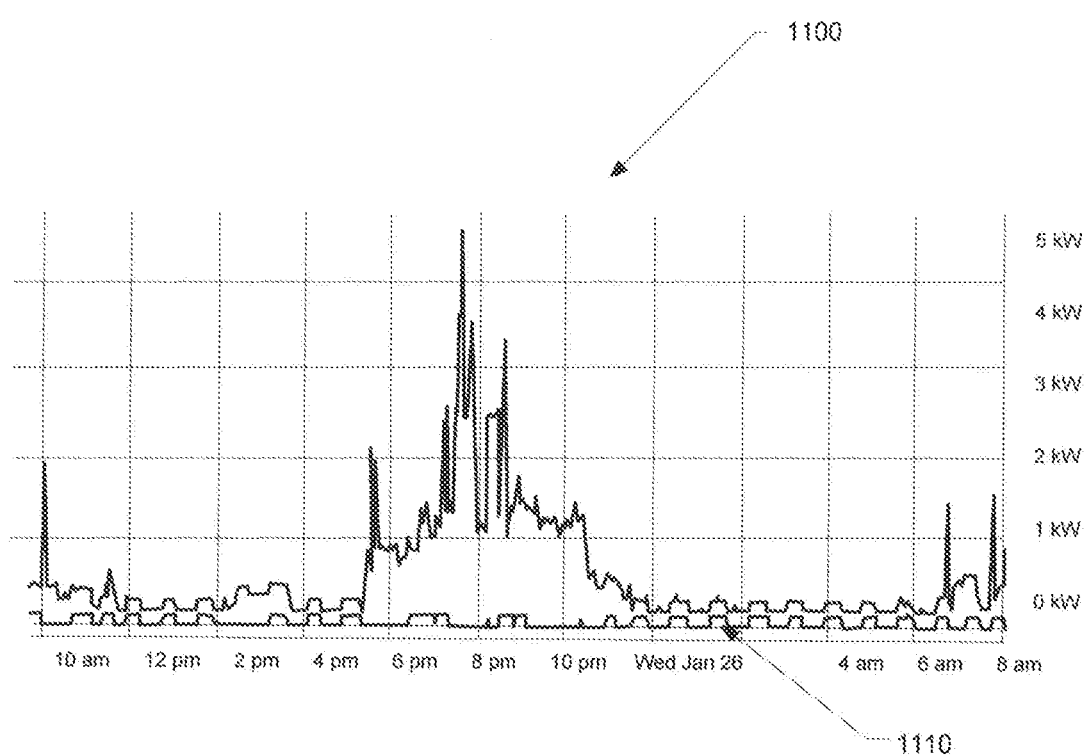
FIG. 11 depicts an exemplary load profile data, with determined refrigerator pulses illustrated, in accordance with some embodiments of the present invention.

With reference to FIG. 11, it can be deduced that the refrigerator is the only active device with a consistent periodic square wave pattern of power consumption 1110. This assumption is based on the prior knowledge that in a refrigerator, the compressor turns on periodically at approximately uniform frequency. While there is the possibility that other devices may occasionally turn on and off during those periods, but it is very low probability for such appliances to have the same square pulse pattern of consumption, as well as have similar levels of real and reactive power profile as a refrigerator. In some embodiments, the following process may be conducted:

(a) The identified always on power draw is reviewed, and transitions in the load profile are identified. A transition may be identified as a minimum change in instantaneous power (for example, a change in power draw of plus or minus twenty (20) watts or more, between two successive samples).

(b) Once the transitions are computed, the positive transitions are quantized into groups such as twenty (20) to thirty (30) watts, thirty (30) to forty (40) watts, etc. The outlier groups (for example, the highest and lowest 5%) are then discarded. The most common or frequent transition is then identified by the mode, median, or mean of the groups.

(c) Next, only approximately thirty (30) % of the transitions centered around the most common transition are maintained and for each remaining transition, the corresponding negative transition in the input (e.g., that corresponds to the appliance turning off) are identified.

(e) The transitions are then grouped by duration, and the largest group is identified.

(f) It can be assumed that the refrigerator consumes the energy corresponding to the value of the transitions in this group and that it consumes that much power for the duration corresponding to the duration of this group.

Once the energy level and the duration of the refrigerator is identified, a pattern matching algorithm can be utilized to detect from the original input (that is, the whole house composite load signal) when it turns on and off. In some embodiments of the present invention, the algorithm can be operated on the low activity data and the results extrapolated over time. Utilizing either method, the total daily energy consumption of the refrigerator as well as the instantaneous energy consumption of the refrigerator may be determined.

Note that either real power or reactive power may be utilized for such determinations or calculations. This process can be used to identify other appliances other than the refrigerator. For example, a pool pump typically consumes much more electricity for a three (3) to six (6) hour period than in the remaining eighteen (18) to twenty-one (21) hours. Accordingly, a "High-Activity Period" may be segregated from the whole house composite load signal rather than a "Low-Activity Period." Such a process may extract the pool pump signature from the whole house load profile data.

Note that other loads—such as the draw required to charge electric vehicles (EV), distributed generation techniques (solar, wind, etc.), and distributed storage (for example, large and high density batteries). Such concepts can also be applied to smaller loads such as consumer electronics (e.g., televisions, DVD players, etc.), lighting, and phantom loads.

Using Finite State Machine for Appliance Representations

Figure 12:
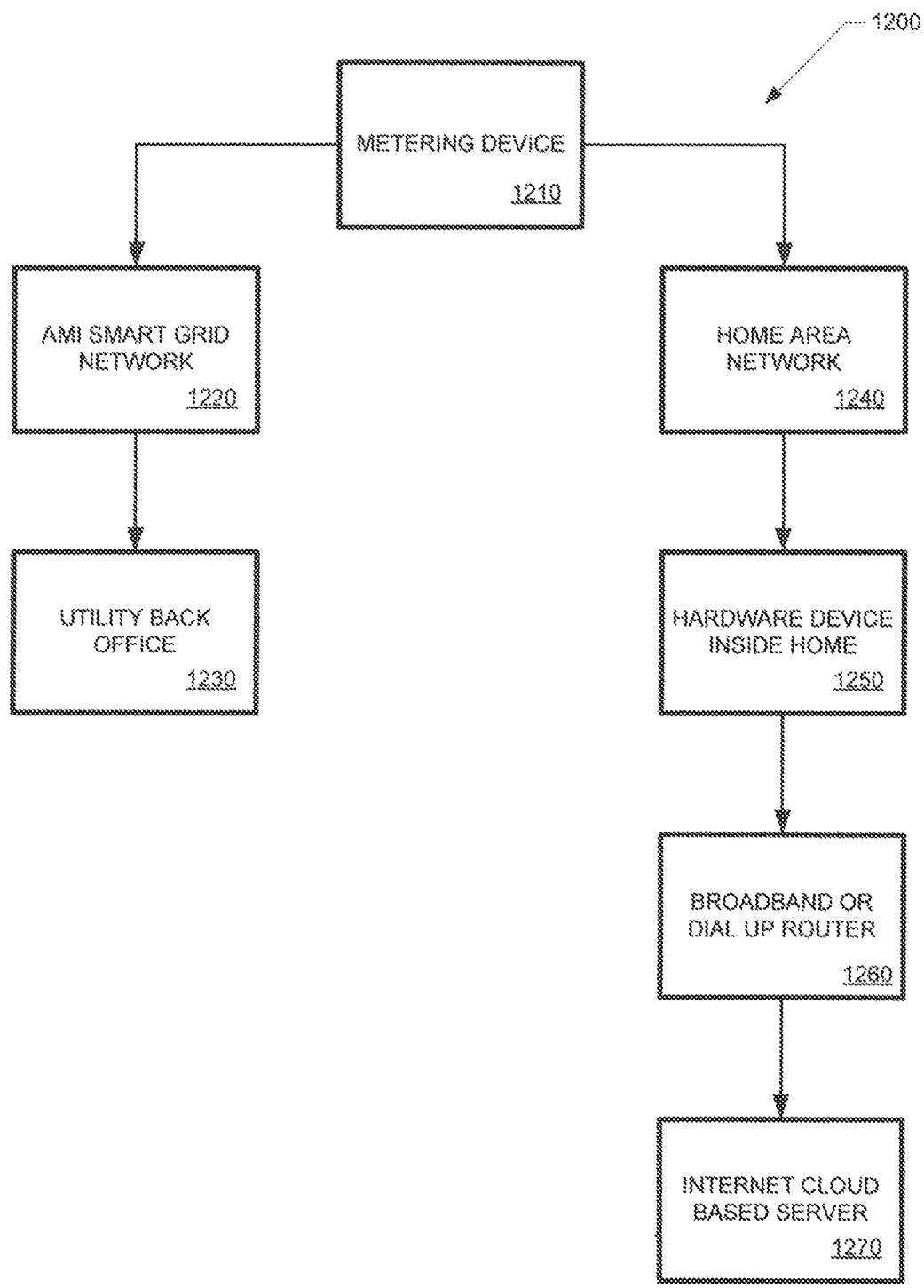
FIG. 12 illustrates how data may flow for software based disaggregation and various locations or devices where the software based disaggregation may be performed on the data collected from the metering device, in accordance with some embodiments of the present invention.

This section describes the approach of state machines to determine energy usage patterns for appliances within a home. Specifically, and with reference to FIG. 12, a system 1200 in accordance with some embodiments of the present invention will now be discussed. System 1200 may comprise a metering device 1210 in communication with a utility back office 1230 via a network 1220 (as a non-limiting example, via advanced metering infrastructure (AMI) smart grid network). The metering device 1210 may also send data to a device 1250 inside the house or building being measured. This data may be sent via a home area network (HAN) 1240, which can be implemented using any radio frequency (RF), programming logic controller (PLC) or any similar open or proprietary technology. The data measured and/or captured by the metering device 1210 may then be transferred to an internet server (1270) using a router 1260 (e.g. broadband router, dial-up router, etc.) located in the home or building.

Note that while the discussion below is primarily directed towards the algorithm operating on an internet server (i.e., on the "cloud"), it is fully contemplated by the Applicants that the algorithm can operate in a device inside the home or building (for example, in the device inside the home or in the router itself), inside the metering device 1210 itself, and/or in the back office of the utility providing the energy.

Appliances often move from one stage to the other as a part of their functional behavior, before moving to a final state of shutdown where the appliance ceases to use any energy. Such appliance uses energy in a fixed number of stages from start-up to shut-down. In general, each of these stages may be mapped to a finite state in a finite state machine. When an appliance moves from one state to another, this transition (which may be either a positive or a negative transition) may be identified. If the state machine for each of the appliance is defined and available, the energy usage for each appliance may be separated out from the net energy usage waveform—i.e., the whole house composite load signal. In order to exercise these state machines on the whole house data, it is required to break up the energy usage in terms of the transitions over a period of time.

Moreover, a first appliance category state machine (for example, a clothes dryer) may look very different from a second appliance category state machine (for example, a clothes washer). However, it is desirable to distinguish the two appliances that belong to same category but represent different behaviors (power consumption, turn on/off durations etc.). Appliance state specific parameters to distinguish different appliances belong to the same category. For example, the parameters used to represent a particular state in refrigerator may be: amplitude, on time and duty cycle. Two refrigerators identified in two different homes may have different power consumption characteristics which are characterized using the parameters defined for each state in refrigerator state machine.

Figure 13:
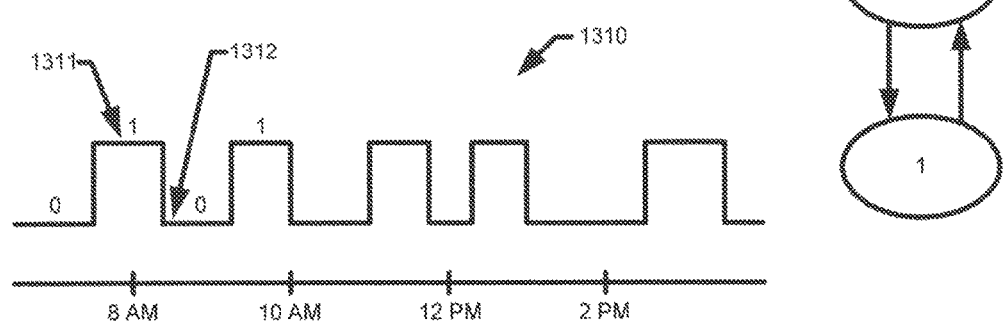
FIG. 13 shows a representation of a refrigerator using finite state machine and parameterization processes, in accordance with some embodiments of the present invention.

With reference to FIG. 13, an example of a refrigerator being represented as a finite state machine (FSM) is depicted, in accordance with some embodiments of the present invention. Exemplary parameters of the refrigerator are as follows:

| State | Parameter 1 = Amplitude | Parameter 2 = Duration in this State |
|---|---|---|
| 0 | 0 Watts | 20-23 minutes |
| 1 | 120-130 Watts | 31-36 minutes |

The refrigerator produces a waveform 1310 that generally varies between being on, 1311 or off 1312. The on-off cycle can be further simplified by diagram depicted at 1020. This is a relatively consistent cycle.

Figure 14A:
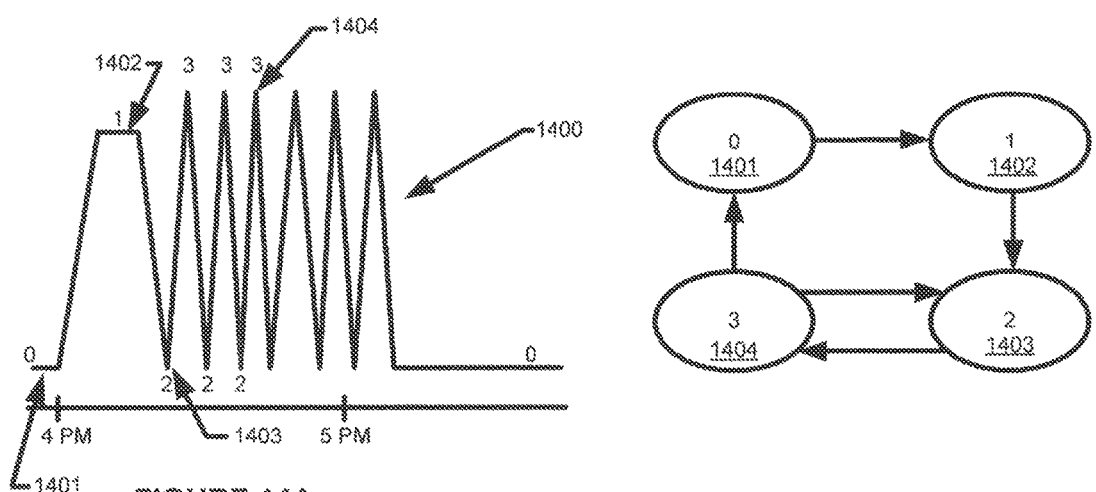
FIGS. 14A and 14B show a representation of a clothes dryer using an exemplary parameterization process, in accordance with some embodiments of the present invention.
Figure 14B:
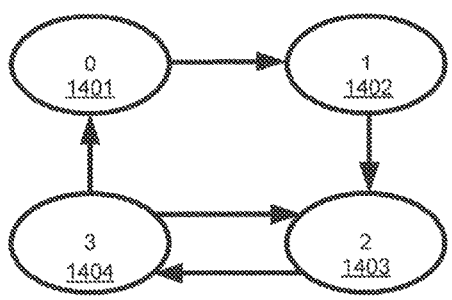

With reference to FIGS. 14A and 14B, a clothes dryer may be slightly more complicated. Exemplary parameters (which are not accurate but for demonstrative purposes) for a clothes dryer may be as follows:

| State | Parameter 1 = Amplitude | Parameter 2 = Duration in this State |
|---|---|---|
| 0 | 0 Watts | N/A |
| 1 | 4800-5050 Watts | 8-20 minutes |
| 2 | 250-290 Watts | 1-5 minutes |
| 3 | 4800-5050 Watts | 2-8 minutes |

The waveform 1400 of the clothes dryer energy usage may comprise the various states discussed above. State 0 at 1401, state 1 at 1402, state 2 at 1403, and state 3 at 1404. With reference to FIG. 14B, it is evident how the operation of the appliance cycles through these various states.

Utilizing Smart Meters as Known in the Art as Metering Devices for NIALM

Note that it is contemplated that the metering device discussed above (e.g., metering device 410 in FIG. 4) may comprise what is generally known in the industry as a "Smart Meter." Smart Meters may provide data for NIALM techniques through various methods. For example, the Smart Meter may send data back to a utility back office, through the advanced metering infrastructure, through a device in the user's home, through a home area network which may transferred to an internet server through a Home Broadband Router or a dial-up router.

Because some embodiments of the present invention may be operated on an internet server in the cloud, in a device inside the home, inside the Smart Meter itself, or in the utility back office. However, unmodified Smart Meters have some drawbacks when providing data for NIALM techniques.

However, Smart Meters generally record and transmit data in fifteen (15) minute intervals. This data is often too broad to support accurate means of non-intrusive appliance load monitoring. However, the Smart Meter and existing advanced metering infrastructure (AMI) can be utilized to provide more specific data without any sub-metering hardware. For example, in general Smart Meters consistently record data but only send back data based upon the fifteen (15) minute sampling. In order to provide accurate disaggregation, data based upon one (1) second sampling is desirable. However, such increased sampling requires a much greater amount of bandwidth and memory than is generally available in the Smart Meter and AMI.

However, in accordance with some embodiments of the present invention, Smart Meters can sample data in one (1) second intervals and the data can be compressed by storing the one (1) second sampled data for a period of time as memory permits—for example, fifteen (15) minutes. This window can then be pared down. For example, every five (5) minutes the one (1) second sampled data can be processed and only the transitions over a particular threshold may be stored. Establishing a threshold (for example, 20 W active power) may assist in reducing the noise captured by the data, which has the undesirable effect of increasing the total amount of data transmitted while not providing any increase in the amount of useful data.

Once the transitions are stored (including the time of the transition as well as the active and reactive power of the transition), the one (1) second sampling rate for the five (5) minute period may be deleted. This process may continue on a rolling basis, providing a compression result of approximately 30:1. The compressed data can be used to reconstruct the one (1) second data in order to effectively run NIALM techniques.

For example, a common household with three (3) adults may prove approximately 691 kb per day of data based upon one (1) second sampling. Since experimentation has shown that a common household of three (3) adults yields approximately 3,000 transitions per day, compressing this data in the manner discussed above should result in approximately 24 kb of data—an amount that both Smart Meters and the AMI can handle without depleting available bandwidth.

Note that it is fully contemplated by the inventors that the present invention is equally applicable to natural gas consumption by consumers. Combined with non-electrical information such as weather reports, size of the property, number of people in the house and gas usage patterns, the natural gas consumption can also be disaggregated into individual appliances including furnaces (and various types of furnaces), water heaters, and cooking ranges. In addition, although the disclosure above discusses households, the invention is also equally applicable to commercial buildings and units, for example restaurants, fast food and coffee shops, retail stores, and other commercial establishments that require energy loads such as refrigerators, fryers, freezers, industrial equipment, pumps, heating ventilation and air condition (HVAC) systems, and lighting.

In addition, it is fully contemplated that the results of the above-discussed systems and methods may be displayed and provided to users (for example, residents of such measured households) in various manners. In some contemplated embodiments, users may access a secure web portal that may display a disaggregated appliance level itemized electric bill. Such access may be available for see data in real or near real time, trends, etc. Such data may also aggregate various data from other households to present to users (for example, the user may learn that his or her household utilizes 35% more energy than average in the neighborhood). Such information may also be present via mobile telephone and computing devices, and may also be printed or included in utility bills.

Obtaining User Feedback to Validate and Improve NIALM Results

Current methods of disaggregating a composite load into individual appliances loads are general based on obtaining accurate signatures of appliances for pattern matching in the user load profile obtained outside the property. Since the accuracy of the detection of appliances in current methods is dependent on matching the generic appliance signatures to the actual appliances in the property, it is often beneficial to have the user provide system level training to gather the property specific appliance signatures. This may be accomplished in several ways. Generally, methods of user training employed in the prior art require high level of effort by user to train the system and therefore run the risk of losing user interest in the system altogether. However, in accordance with some embodiments of the present invention, methods of gathering appliance signatures supported by user involvement will be discussed. Specifically, the users may be asked to (a) validate that the appliance detected by the system are accurate; and/or (b) ask the user to tag an appliance in the interactive charts (or a similar mechanism) if the system detects repeating patterns, but cannot classify such patterns into any appliance.

Figure 15:
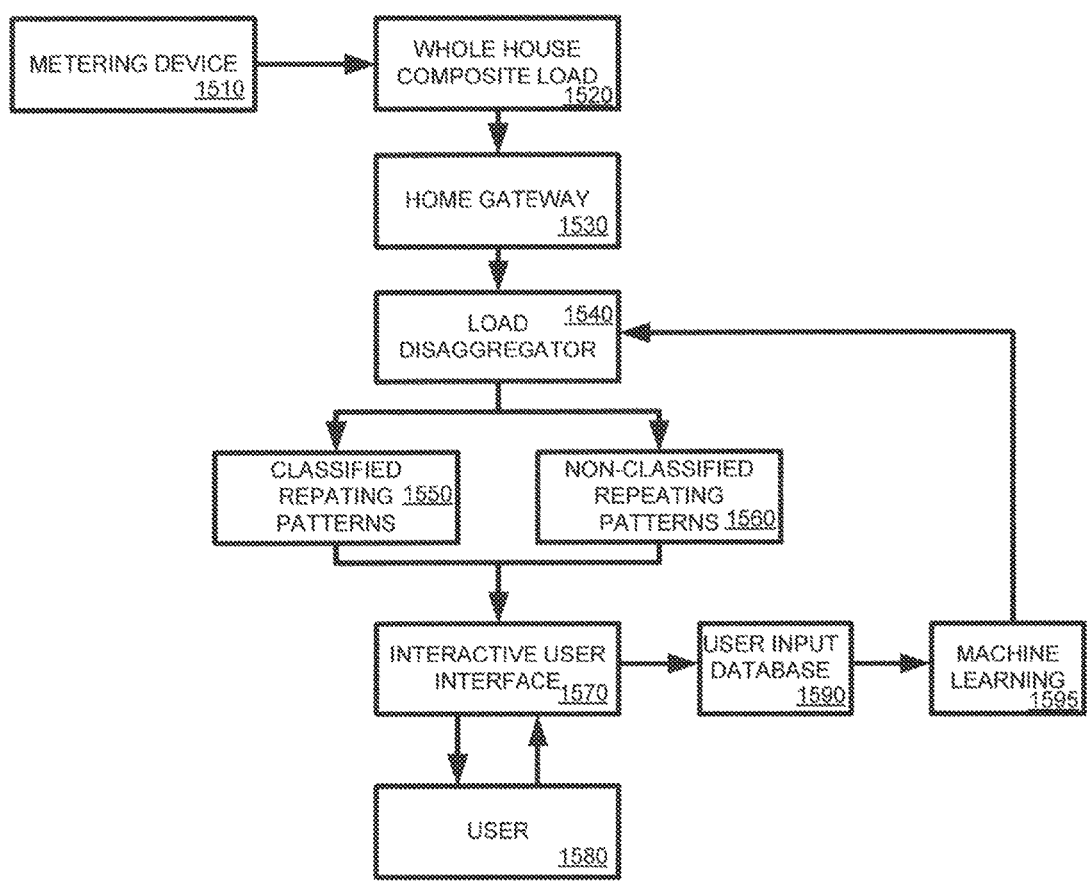
FIG. 15 illustrates a system of appliance-level disaggregation in accordance with some embodiments of the present invention.

With reference to FIG. 15, a system 1500 of obtaining and utilizing user feedback, in accordance with some embodiments of the present invention, will now be discussed. System 1500 generally comprises a metering device 1510, a home gateway 1530, a load disaggregator 1540, an interactive user interface 1570, and a database 1590.

The metering device 1510, which may be any type of metering device discussed above, may measure and/or record energy usage for a home or building, and may generate, measure, and/or record a whole house composite load signal 1520, which is representative of the total energy usage of the home or building. The metering device 1510 may pass the whole house composite load signal 1520 through the home gateway 1530 to the load disaggregator 1540.

The home gateway 1530 may be a device inside the house that receives the energy usage data from the metering device 1510 and either runs the disaggregation software itself, or sends the data to a hosted server for disaggregation. Accordingly, the load disaggregator 1540 may be a piece of software or hardware that may run on the metering device 1510 itself, the home gateway 1530, or on a hosted server. The load disaggregator 1540 may break down the whole house composite load signal 1520 into repeating patterns. Such patterns may then be classified into appliances, or may potentially remain unclassified if the load disaggregator 1540 does not find an adequate match of the pattern. Various patterns—and the corresponding appliances that may produce such patterns—may be stored in a database 1590, with which the load disaggregator 1540 may be in selective communication.

The interactive user interface 1570 may comprise interactive charts that show user patterns of usage and seeks input. For example on a web browser or on a touch screen display in the house, and user input may comprise—for example—a mouse click or touch, depending on the interaction method.

In operation, the load disaggregator 1540 disaggregate the whole house composite load signal 1520 and assign various transitions, or usage cycles, to various appliances. At 1550 the load disaggregator 1540 may detect repeating patterns which are recognized as being a specific appliance (based, for example, upon data stored in database 1590 and provided to the load disaggregator 1540 through machine-based learning system 1595). Alternatively, the load disaggregator may detect at 1560 repeating patterns for which it cannot identify an appliance.

The load disaggregator 1540 may convey this information to the interactive user interface 1570 which may present to the user the information related to matched and unmatched energy usage patterns and appliances. The user 1580 may then be requested, and may supply, input as to the accuracy of the matched patterns and identify of the unmatched patterns.

Figure 16:
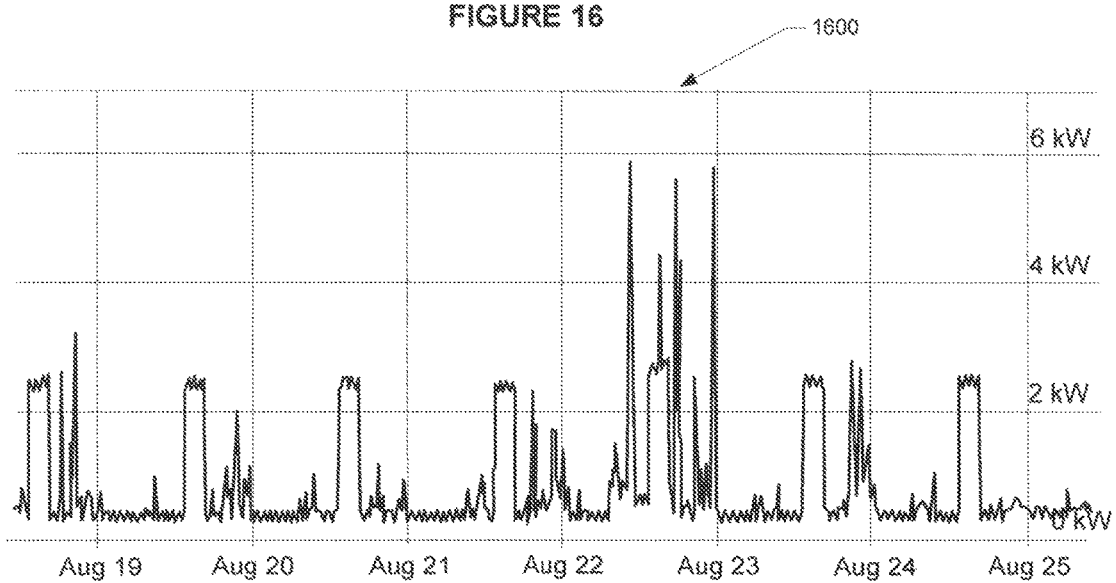
FIG. 16 shows an exemplary interactive chart, in accordance with some embodiments of the present invention.
Figure 17:
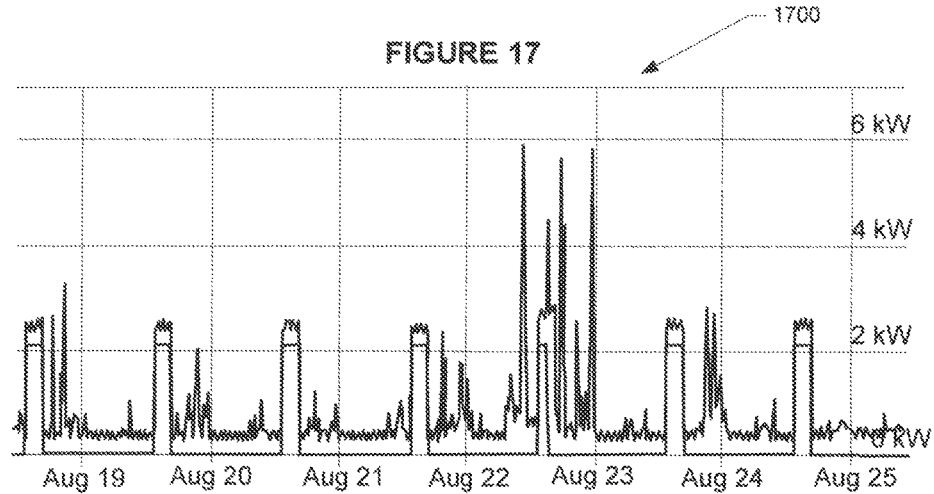
FIG. 17 shows an exemplary interactive chart showing a single appliance pattern, in accordance with some embodiments of the present invention.

Specifically, the user may be presented with a week's worth of energy usage, as depicted by waveform 1600 in FIG. 16. The user may select an appliance—with reference to FIG. 17, for example, a pool pump—and the wave pattern attributed to the pool pump 1700 may be identified and clearly set forth for the user. The user may be able to select various appliances that have been identified by the load disaggregator 1540 through the use of selection tools, for example those shown at reference numeral 1710 in FIG. 17, though other means of selecting specific appliances are contemplated. The user may also view the patterns attributable to, for example, a refrigerator or dryer.

When viewing the waveform presumed by the load aggregator to be attributable to the pool pump, the user may realize that the load aggregator is incorrect—for example, it may be winter and the pool pump may not be functioning. If the user believes that the classification of a pattern into a specific appliance by the system is incorrect, the user may select on "Incorrect" next to the detected appliance or pattern. The user may then be asked to either (a) retag the identified pattern into another appliance; or (b) untag the pattern into an unclassified appliance. With regard to retagging the identified pattern, the system may provide a list of other appliances to which the pattern may belong. The load aggregator may not display all appliances in the household, but rather alonly those that have similar patterns. With regard to untagging, the user may not know what appliance corresponds to the pattern, but may know that the appliance identified by the load aggregatoris incorrect.

The user may therefore untag the pool pump as the appliance contributing the waveform. At this point, and with reference to FIG. 18, the user may be presented with various options at 1810 of what appliance may have used the energy at issue. If the load aggregator has determined a potential alternate appliance, it may be presented to the user for confirmation. For example, at 1810 the user may be presented with the option of a "Heater" as opposed to a pool pump.

Figure 20:
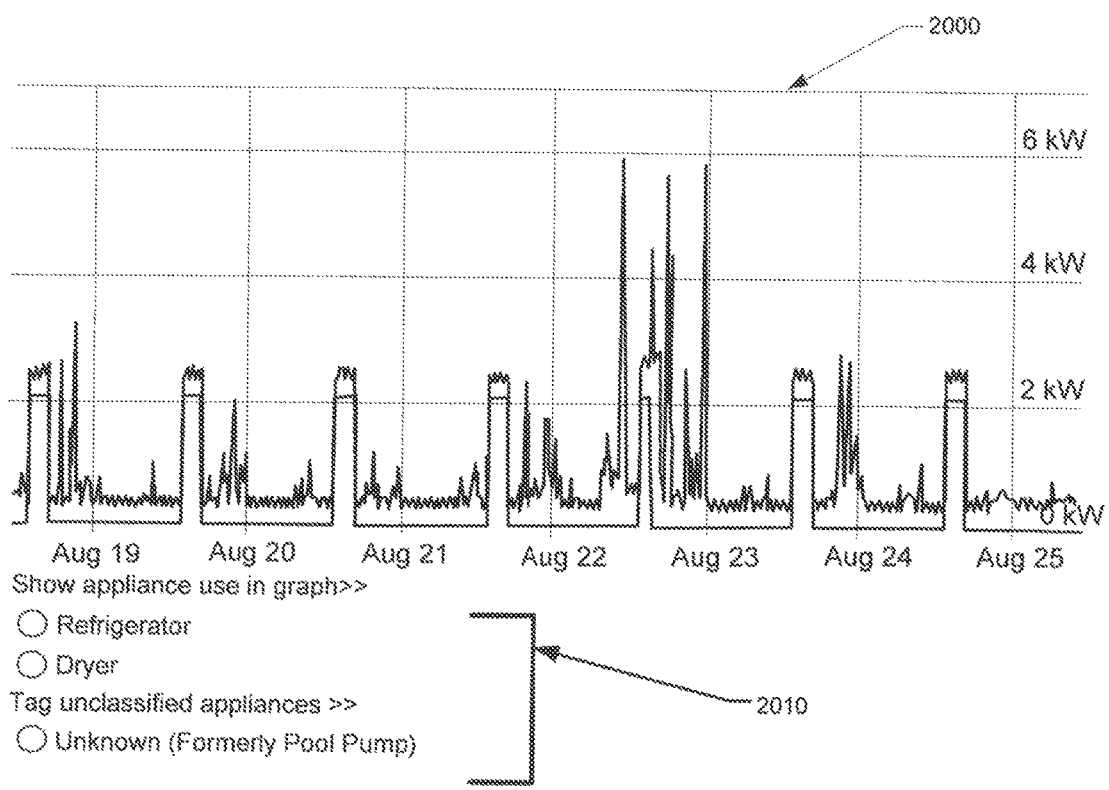
FIG. 20 shows an example of an interactive chart where a user has untagged an appliance previously classified by systems in accordance with some embodiments of the present invention.

If the energy draw is in fact due to the heater, and the user is aware of this, the user may retag the pattern with the heater identified as the source. With reference to FIG. 19, once the pattern is retagged as the heater, all patterns that were attributable to the pool pump are reclassified as the heater. Alternatively, as shown in FIG. 20, the user may not know the true source, and may simply leave the pattern untagged (or identified as "Unknown").

The machine based learning system 1595 may translate the user input into a learning mechanism for the load disaggregator 1540. For example, the load disaggregator 1540 may present, via the interactive user interface 1570, a detected pattern for user validation. A user may validate, invalidate, or correct the appliance assigned by the load disaggregator 1540 to the appliance. Note that while the load disaggregator may utilize user inputs, it may not base appliance identification solely on user based inputs. For example, a user may attempt to identify a pattern as a refrigerator. However, the load disaggregator may know that a refrigerator never consumes 2 kW and runs only one cycle per day. Accordingly, the load disaggregator may ignore the user input.

However, any tagging, retagging, untagging performed by a user may be utilized in the analyses conducted by the load disaggregator 1540. Note that such learning is not isolated to each home or building. Rather, the load disaggregator 1540 can utilize the inputs received from any user as inputs. Accordingly, while some people may not access their energy use and tag, retag, or untag patterns, the benefits incurred by those that do may be shared with all users of the overall system. Somewhat like crowd-sourcing, the data received from a large amount of samplings may be quickly, accurately, and efficiently obtained.

In accordance with some embodiments of the present invention, the identification of appliances by both the user and the system may be simultaneously maintained (rather than one over-ruling the other). In this manner, two different bits for each pattern or appliance denoted as "User_Defined" and "System_Detected" may be used. In such systems, a user may further give information on appliances in his/her household but the system may never detect a pattern corresponding to that appliance because of the system limitation. Whenever the user tags, retags or untags an appliance, the associated pattern may not be deleted if the input is coming from user and it was initially detected by system or vice versa. Moreover, a list of all the patterns detected by system and all appliances input by user may be maintained as separate entries in the database, and may only be merged when the user tags a pattern with the same appliance identified by the load disaggregator, or the load disaggregator identifies a pattern matching an appliance already input by user.

Once the various systems and methods discussed above are utilized to determine the energy usage of specific appliances in a specific household, it is desirable to inform the user how such information may be used. For example, once specific appliance usage is determined, it may be advisable to (i) reduce use of a specific appliance; (ii) modify the time of use of a specific appliance; or (iii) replace an inefficient appliance.

Reducing the use of a specific appliance may only be reasonable advice if the appliance is optional; in other words, even if a clothes washer or cooking range is inefficient, a user will most likely still be required to use the appliance. However, certain energy usage—such as a pool pump during early spring or autumn months, or a heating or air conditioning system operated while the home is unoccupied—may be reduced. Moreover, a user may be advised of other waste—or "vampire" energy usages that may eliminated.

In addition, it is common for utilities to charge a surcharge for energy use during peak demand hours. The information provided by the systems and methods of the present invention may be utilized by the users or utilities in order to reduce the burden—and cost—of unnecessary energy usage during peak demand times. The user may be informed of the cost savings if, for example, a pool pump is configured to operate during non-peak hours (for example, between 1:00 AM-6:00 AM). A user may also delay or expedite the use of certain appliances based upon peak demands and the costs associated therewith. For example, a user may delay running a washing machine and clothes dryer between 4:00 PM-9:00 PM and instead use the appliance after 9:00 PM (assuming, for example, that peak demand times are between 4:00 PM-9:00 PM).

In addition, the information supplied by the systems and methods of the present invention may be utilized by utilities in order to direct information and or energy reduction requests to homes and/or businesses that typically use large amounts of energy during peak demand times. In this manner, the utility company can reduce costs associated with various education programs while increasing the effectiveness of such programs. Moreover, for homes and/or businesses with significant energy usages during peak demand times, utilities may be equipped with specific information so that the utility may incentivize the home and/or business to reduce its energy usage during such hours.

Users may also utilize the information produced by the systems and methods of the present invention in order to determine whether or not to replace an inefficient appliance. This information may be utilized in at least two (2) exemplary ways: (i) the user may be informed of replacement costs of a new appliance, including time to "break even,"; and (ii) the utility may be informed of appliance energy usage and replacement costs so that the utility may present customized rebates to specific users. Each will be discussed in term below.

Figure 21:
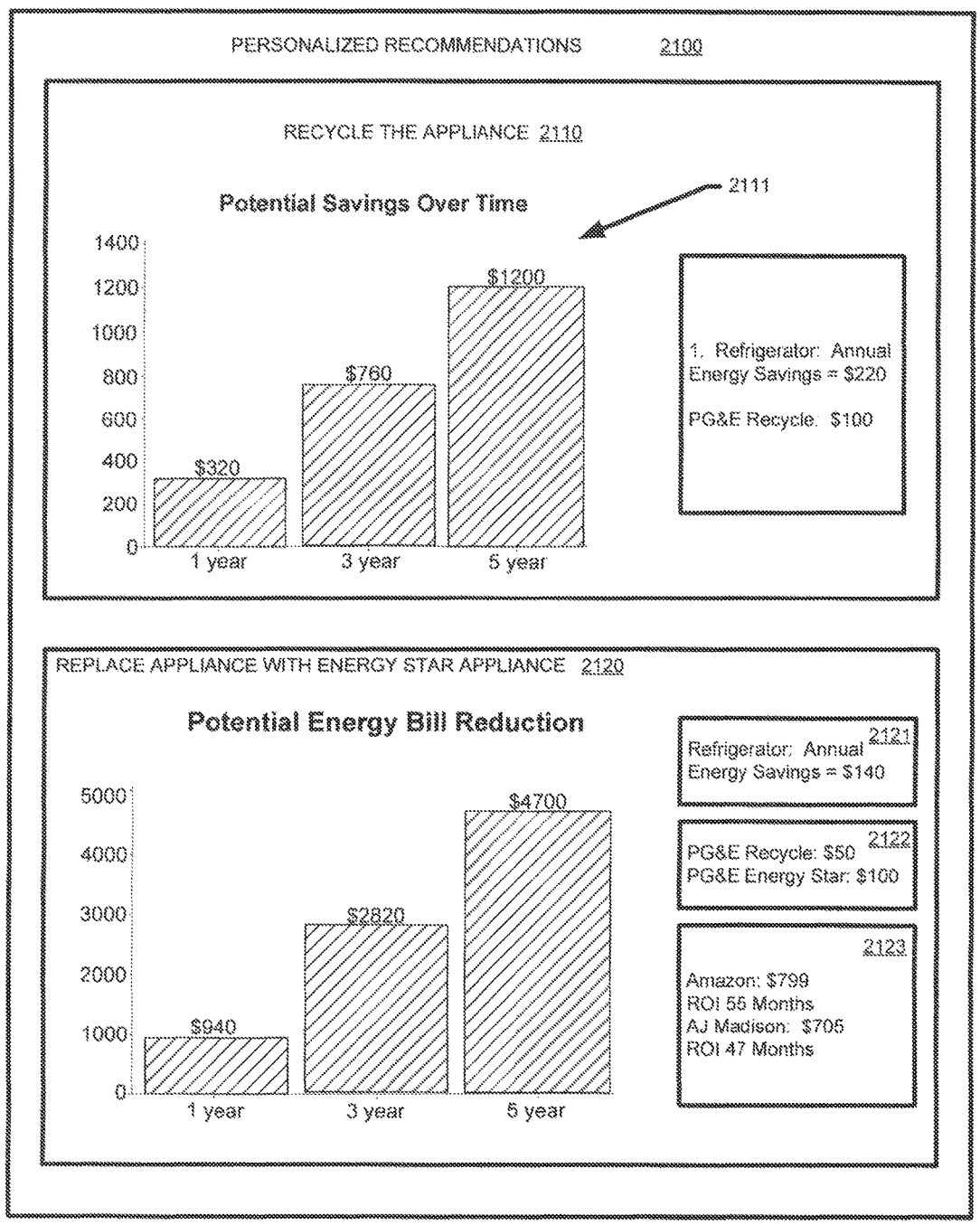
FIG. 21 illustrates a personalized user recommendation, in accordance with some embodiments of the present invention.

With reference to FIG. 21, personalized recommendations directed to users will now be discussed. A user may receive information directed to personalized recommendations 2100. Such information may be available on a website, provided to the user with each or occasional utility bills, or may be periodically mailed or otherwise supplied to the user. Alternatively, a user may elect to receive such information when the user is contemplating replacing one or more appliances.

Personalized recommendation 2100 may be broken into several areas of recommendations, including costs savings based on recycling the appliance at issue 2110, replacing the appliance at issue with an equivalent Energy Star™ rated appliance 2120, shifting energy usage from peak to off-peak hours (not shown), and various manners to eliminate wasted energy (not shown). Information direct to recycling the appliance 2110 may provide the user with the amount of energy savings that eliminating such appliance would provide, as well as any recycling credits that may be offered by utilities, municipalities, and/or any other federal, state, or private organization. For example, with reference to recycling information 2100, a user may be informed that by recycling the appliance—here a refrigerator—annual energy savings may be around $220, and PG&E may provide a $100 recycling credit. Financial savings over time 2111 may be depicted, informing the user the amount of potential savings over various periods of time, for example at one (1) year, three (3) year, and five (5) year periods.

The user may also be presented with personalized recommendations for replacing appliances with Energy Star™ rated appliances 2120. Such replacement information 2120 may comprise information related to annual energy savings 2121 as well as one time credits/rebates/savings that may result from, for example, recycling the old appliance and/or purchasing an Energy Star™ appliance 2122. Moreover, replacement information 2120 may include information directing (and in some embodiments, linking) the user to various retailers that may currently be selling such Energy Star™ replacement appliances 2123. This information may include the cost of the replacement appliance offered by the retailer, and the amount of time to break even, or obtain a return on the investment ("ROI").

It is further contemplated to connect users with such retailers and with lending companies or institutions that may be willing to extend credit to the users to purchase such replacement appliances. In some embodiments, financial arrangements may be agreed to with the user such that although the user's energy usage is reduced by the new appliance, the user may continue to pay the "old" amount associated with his or her previous inefficient appliance. This payment may continue until the new appliance (plus any relevant fees, interest, etc.) is paid off, at which point the user may begin to receive the financial advantages of the new appliance. In the meantime, however, the user is enjoying a new appliance, the utility may be enjoying reduced energy demand, and the user's budget continues as if a new appliance had not been purchased.

In a similar vein, utilities, municipalities, states, federal agencies, or private organizations may use information obtained through the systems and methods of the present invention to offer customized rebates to eligible users. In some embodiments, such rebates may be unique to specific users and non-transferable. Currently, rebates are available for the purchase of Energy Star™ appliances. However, these rebates may be ineffective for several reasons. For example, users are typically only informed of such rebates once users are actively shopping for a new appliance—in other words, such rebates may not provide much motivation to replace an inefficient appliance. In addition, such rebates are generally available to all users, even those who are, for example, outfitting a new home and are not replacing any inefficient appliances. Moreover, such rebates are generally based upon the average amount of lifetime appliance power consumption of a non-Energy Star™ appliance compared to an Energy Star™ appliance.

The information obtained through the systems and methods of the present invention may be utilized to offer customized rebates to eligible users by offering rebates based upon the actual lifetime appliance power consumption of the specific appliances at a user's specific home and/or office building. For example, a fixed rebate program may offer a $100 rebate that may be applied to the purchase of a new Energy Star™ appliance. Under the fixed rebate program, if a user is running a very inefficient clothes dryer the user may receive $100 off of the purchase of a new appliance. However, utilizing the information obtained through the systems and methods of the present invention, it can be determined that the lifetime appliance power consumption saved by replacing inefficient clothes dryer would be worth a rebate of $400, rather than the fixed rebate of $100. Users would be much more enticed to purchase a new Energy Star™ appliance with such greater savings. Similarly, a small commercial enterprise (for example, an ice cream shop) may be using inefficient freezers. Rather than receiving the fixed rebate of $100, a personalized rebate may be created that would save the ice cream shop, for example, $1900 on the purchase of new appliances.

Because such personalized rebates are customized based on the actual energy usage of the user's actual appliances (rather than averages based on various objective data), such personalized rebates may not be transferable. For example, such rebates may be associated with a unique identifier for one-time use by the user. After the rebate is utilized, the systems and methods of the present invention may determine if a new appliance has in fact been installed. If the energy usage is the same—and no replacement appliance has been installed in a reasonable amount of time, it may be concluded that the user inappropriately transferred his or her rebate, and the user may be billed accordingly.

The ability to offer specific personalized rebates offers many opportunities to provide various energy and cost savings. For example, an appliance manufacturer may roll out a new model of a refrigerator, and may be willing to sell older models for a discounted price. Accordingly, the personalized rebates offered to a user may only apply to a specific manufacturer and/or specific model of refrigerator.

Alternatively, various manufacturers and/or retailers may bid on various promotional or rebate offerings. For example, a local utility may seek promotional bids from various manufacturers and/or retailers for rebates associated with new Energy Star™ compliant clothes dryers. For example, in view of the potential bulk sale, a specific manufacturer may be willing to sell its clothes dryers for a 15% discount, while another manufacturer may be willing to offer its older models at a 35% discount. The local utility may compile this information and present either or both such offers to its various residents who currently have inefficient clothes dryers.

It will be understood that the specific embodiments of the present invention shown and described herein are exemplary only. Numerous variations, changes, substitutions and equivalents will now occur to those skilled in the art without departing from the spirit and scope of the invention. Accordingly, it is intended that all subject matter described herein and shown in the accompanying drawings be regarded as illustrative only, and not in a limiting sense, and that the scope of the invention will be solely determined by the appended claims.

What is claimed is:

1. A system for detecting individual appliance energy loads from a whole house composite load profile, comprising:
   a transitions generator, that receives the whole house composite load profile and identifies transitions within the whole house composite load profile;
   a detector in selective communication with the transitions generator, that receives transitions from the transitions generator and determines a household specific appliance state machine for each appliance in the household, the household specific appliance state machine comprising transitions associated with different functions, if any, of the appliance, thereby modeling an inner mechanism of the appliance; and
   a solver in selective communication with the detector, which receives as input all of the transitions identified by the transitions generator and the household specific state machines from the detector, and parses all transitions received from the detector as a whole, thereby assigning each transition to a household specific appliance state machine, and disaggregating the whole house composite load profile into individual appliance energy loads.

2. The system of claim 1, further comprising a transitions broker in selective communication with the solver, the transitions broker configured to assign transitions to the determined household specific state machine, in situations where the transition may apply to multiple household specific state machines.

3. The system of claim 2, wherein the transitions broker is in selective communication with a repository of non-electrical information, which is used to assist in properly assigning transitions to the determined household specific state machines.

4. The system of claim 3, wherein the repository of non-electrical information comprises one or more types of information selected from the group consisting of: third party data, heuristics, and user input.

5. The system of claim 4, wherein the third party data comprise information selected from the group consisting of: household square footage; household occupancy, temperature data, heating degree days, cooling degree days, neighborhood data, and municipality data.

6. The system of claim 4, wherein the user input is received from any user of the system in identifying an appliance determined to correspond to specific energy usage.

7. A method for creating an appliance signature based upon a whole house composite load profile, comprising:
    identifying primitive elements comprising transients and absolute steady state levels;
    combining primitive elements to form impulses, using multi-dimensional clustering to group primitive elements along multiple dimensions;
    combining impulses to form simple bundles;
    combining simple bundles with other simple bundles or with impulses to form complex bundles, the complex bundles combining simple bundles associated with different functions of an appliance;
    determining, based upon the complex bundles, specific appliance signatures that substantially match the complex bundles, and identifying the specific appliance signatures from the whole house composite load profile.

8. The method of claim 7, wherein the multi-dimensional clustering clusters primitive elements according to one or more dimensions selected from the group consisting of: amplitude, periodicity, frequency, pulse width of impulses, on-time of impulses, rising edge slope, falling edge slope, time of day, time of week, and time of month.

9. A method for detecting individual appliance energy loads from a whole house composite load profile, comprising:
    determining transitions within the whole house composite load profile;
    determining household specific appliance state machines for each appliance in the household, the household specific appliance state machine comprising transitions associated with different functions, if any, of the appliance, the determined transitions being parsed together in order to model an inner mechanism of the appliance;
    disaggregating the whole house composite load profile into individual appliance energy loads by assigning each of the determined transitions to the determined household specific appliance state machines.

10. The method of claim 9, wherein the transitions are determined within the whole house composite load profile by:
    identifying minimum and maximum power levels within an identified temporal window;
    comparing the minimum and maximum power levels with the previous or last known power levels; and
    identifying a transition if the difference between the minimum and maximum power levels and the previous or last know power levels is greater than an allowable noise margin, wherein the amplitude of the transition is the amplitude of the change in power levels.

11. The method of claim 9, wherein the transitions are assigned based in part upon communication with a repository of non-electrical information used to assist in properly assigning transitions to the determined household specific state machines.

12. The method of claim 11, wherein the repository of non-electrical information comprises one or more types of information selected from the group consisting of: third party data, heuristics, and user input.

13. The method of claim 12, wherein the user input is received from a user in identifying the determined appliance that corresponds to specific energy usage.

14. The method of claim 13, wherein the user input comprises a user, when presented with information regarding appliances matched to particular energy usages, confirming or negating such match.

15. The method of claim 13, wherein the user input comprises a user, when presented with information regarding particular energy usage, identifying an appliance that caused the particular energy usage.

16. The method of claim 15, wherein the user selects the appliance that caused the particular energy usage from a set of potential appliances presented to the user.

17. The method of claim 9, wherein the step of disaggregating the whole house composite load profile by assigning the determined transitions to the determined household specific appliance state machines comprises assigning the determined transitions based upon one or more rules selected from the group consisting of:
    (i) assigning transitions to only one state machine;
    (ii) assigning transitions active state machines over non-active state machines; and
    (iii) assigning transitions to more complex state machines over less complex state machines.

18. A method of incentivizing users to replace inefficient appliances with efficient appliances based upon energy usage data measured from the user's specific inefficient appliances, comprising:
    determining an appliance load signature from the user's specific appliance, determined from a whole house composite load signature, wherein such determination is based at least in part on:
        determining transitions within the whole house composite load profile;
        determining household specific appliance state machines for each appliance in the household, the household specific appliance state machine comprising transitions associated with different functions, if any, of the appliance, the determined transitions being parsed together in order to model an inner mechanism of the appliance;
        disaggregating the whole house composite load profile into individual appliance energy loads by assigning each of the determined transitions to the determined household specific appliance state machines;

determining an appliance signature from an alternative appliance;

presenting to the user the difference in energy usage and associated costs between the user's specific appliance and the alternative appliance.

19. The method of claim 18, further comprising:

generating a personalized incentive for the user based at least in part on the difference in energy usage and associated costs between the user's specific appliance and the alternative appliance.

20. The method of claim 18, further comprising:

presenting to the user a purchase price for the alternative appliance and the time required for the user to see a return on investment if the alternative appliance is purchased.

21. The method of claim 20, further comprising:

identifying potential funding sources for the user to obtain credit or other funding in order to purchase the alternative appliance.

\* \* \* \* \*